United States Patent
Yokoyama et al.

(10) Patent No.: US 7,186,448 B2
(45) Date of Patent: Mar. 6, 2007

(54) COMPOSITION AND METHOD FOR TEMPORARILY FIXING SOLID

(75) Inventors: Yasuaki Yokoyama, Tokyo (JP); Nobuo Bessho, Tokyo (JP); Masaaki Hanamura, Tokyo (JP)

(73) Assignee: JSR Corporation, Tokyo (JP)

( * ) Notice: Subject to any disclaimer, the term of this patent is extended or adjusted under 35 U.S.C. 154(b) by 103 days.

(21) Appl. No.: 10/483,178

(22) PCT Filed: May 12, 2003

(86) PCT No.: PCT/JP03/05899

§ 371 (c)(1),
(2), (4) Date: Jan. 9, 2004

(87) PCT Pub. No.: WO03/095579

PCT Pub. Date: Nov. 20, 2003

(65) Prior Publication Data

US 2004/0185187 A1   Sep. 23, 2004

(30) Foreign Application Priority Data

| | | |
|---|---|---|
| May 13, 2002 | (JP) | 2002-136995 |
| May 30, 2002 | (JP) | 2002-157059 |
| May 30, 2002 | (JP) | 2002-157060 |
| Aug. 13, 2002 | (JP) | 2002-235607 |
| Sep. 27, 2002 | (JP) | 2002-282307 |
| Mar. 6, 2003 | (JP) | 2003-059542 |
| Mar. 7, 2003 | (JP) | 2003-061792 |
| Mar. 7, 2003 | (JP) | 2003-061793 |

(51) Int. Cl.
- *C09K 19/02* (2006.01)
- *C09J 11/00* (2006.01)
- *C09J 5/04* (2006.01)
- *C09J 5/06* (2006.01)
- *H01L 21/68* (2006.01)

(52) U.S. Cl. .............. 428/1.5; 252/299.01

(58) Field of Classification Search .......... 252/299.01, 252/299.5; 428/1.1, 1.5
See application file for complete search history.

(56) References Cited

U.S. PATENT DOCUMENTS

| | | | | |
|---|---|---|---|---|
| 5,084,203 A | * | 1/1992 | Sansone et al. | 252/299.5 |
| 5,680,185 A | * | 10/1997 | Kobayashi et al. | 349/88 |
| 5,766,509 A | | 6/1998 | Kawata et al. | |

FOREIGN PATENT DOCUMENTS

| | | |
|---|---|---|
| DE | 39 07 261 A1 | 9/1990 |
| JP | 2-32184 | 2/1990 |
| JP | 7-305036 | 11/1995 |
| JP | 8-20762 | 1/1996 |
| JP | 8-53156 | 2/1996 |
| JP | 8-81668 | 3/1996 |
| JP | 9-188868 | 7/1997 |
| JP | 9-302070 | 11/1997 |
| JP | 10-284444 | 10/1998 |
| JP | 11-71567 | 3/1999 |
| JP | 11-71568 | 3/1999 |
| JP | 2001-89420 | 4/2001 |
| JP | 2001-303019 | 10/2001 |
| JP | 2002-066911 | 3/2002 |
| JP | 2002-249761 | 9/2002 |

OTHER PUBLICATIONS

English abstract for JP 02-202981, 1990.*

* cited by examiner

*Primary Examiner*—Shean C Wu
(74) *Attorney, Agent, or Firm*—Oblon, Spivak, McClelland, Maier & Neustadt, P.C.

(57) ABSTRACT

The present invention relates to a method of temporarily and firmly fixing two solids to each other and to a composition used in the method, which is a method of temporarily fixing, comprising temporarily fixing the two solids to each other with a liquid crystal compound or a composition comprising the liquid crystal compound. This method is used for a method of temporarily fixing a pad for chemical mechanical polishing, for example, to polish a wafer for a semiconductor device fixed on a surface of a base plate, when one solid is a pad for chemical mechanical polishing of a wafer for a semiconductor device and the other is a base plate to fix the pad.

4 Claims, No Drawings

COMPOSITION AND METHOD FOR TEMPORARILY FIXING SOLID

FIELD OF THE INVENTION

The present invention relates to a method of temporarily fixing two solids to each other and to a composition used in the method. More specifically, it relates to a method of temporarily fixing two solids to each other, which makes it possible, for example, to fix a solid such as a semiconductor device to a substrate in order to process it and to easily remove the solid from the substrate after processing, and to a composition used in the method.

PRIOR ART

It is often seen as one of the current economic activities that after one solid is firmly fixed to another solid and processed, the two solids must be separated from each other.

For instance, in repair work which is carried out when a crack or crevice is formed in the wall of a building, in order to prevent the leakage of a resin injected from an injection part or a part therearound, a temporary stopping seal is affixed to the crack or crevice, the resin is injected, the injected resin is cured, and the seal is removed. If a conventionally known adhesive is used, the wall may be damaged when the seal is removed.

In this case, a fixing method which can provide adhesive strength against the injection pressure of a repairing resin and enables the resin to be removed easily after repair is desired (see JP-A 2002-249761) (the term "JP-A" as used herein means an "unexamined published Japanese patent application").

In a treatment for providing a fine surface to various materials and the temporary fixing of a wooden frame for the production of an artistic handicraft, there is often seen a case where after one solid is firmly fixed to another solid and processed, it must be separated from the above solid. A solid fixing agent which has fixing strength and separation ease, a method of fixing a solid and a separation method used in the above case are yet to be proposed.

Further, in the case of a semiconductor device, a circuit such as an IC or LSI is formed in a large number of areas arranged on the surface of a substantially disk-like semiconductor wafer in a lattice form, and the areas having the circuit formed therein are diced along predetermined cutting lines to produce semiconductor elements in the production process of a semiconductor device. To improve the heat radiation of each semiconductor element and to enable the downsizing of a mobile apparatus such as a portable telephone, the thickness of the semiconductor element is desirably made as thin as possible. To this end, before the semiconductor wafer is divided into semiconductor elements, the rear surface of the semiconductor wafer is ground to a predetermined thickness. Although the semiconductor elements must be firmly fixed to the base plate of a grinder in the grinding step, they must be separated from the grinder after grinding. However, the semiconductor wafer and the semiconductor elements which are formed thin are fragile due to reduced stiffness and may be broken in the separation step.

In this case, firm fixing is required in the grinding step and separation ease is required after the grinding step. A fixing method and a separation method which meet the above requirements are desired (see JP-A 2002-66911).

That is, the front surface and/or rear surface of a semiconductor wafer and/or a device mounting wafer are/is variously processed according to application purpose. For example, in surface processing for making the front surface and/or rear surface uniform with a surface processing technique such as chemical mechanical polishing (CMP), the reference face to be processed of a workpiece must be set and a material to be processed must be kept on a certain level at the time of processing. The front surface or rear surface of a wafer is closely adhered to a hard plate and/or an elastic carrier (backing) as the reference face to hold the wafer. Thus, the wafer must be precisely held at the time of processing.

As means of closely adhering the front surface or rear surface of the wafer to a hard plate and/or an elastic carrier (backing), or glass or ceramic substrate and/or substrate for a wafer or the like to hold the wafer as a workpiece, there is, for example, a method called "wax mounting method". In this wax mounting method, the rear surface of a wafer and a hard plate having a high-precision surface (for example, a ceramic plate having a high-precision plane) are closely adhered to each other (the rear surface of the wafer is called "reference") by using wax as an adhesive. With this method, the processing of the front surface of the wafer is carried out as followed the model of the rear surface of the wafer by controlling the flattening accuracy of the surface of the hard plate and the thickness of the wax. Since the surface of the wafer to be processed must be basically flat in this method, this method is said to be unsuitable for the processing of a wafer in the step of mounting a device and is widely used for the surface processing of bare silicon. However, wax used as an adhesive for this surface processing has a contamination problem because it is difficult to clean it after processing and metal impurities contained in the wax remain on the surface of the wafer after cleaning and migrate to the wafer or device.

When the surface of the wafer such as a silicon wafer is to be processed, the surface not to be processed of the wafer as a workpiece must be kept in a specific required state as in the case of CMP. To this end, various adhesives have been developed. Materials which are generally called "adhesive" cannot be easily removed when the wafer as a workpiece is separated from the substrate after processing, resulting in the broken wafer. Further, the removal and/or cleaning of an adhesive layer formed on the removed wafer are/is difficult, resulting in the contaminated wafer. Particularly when the rear surface of a wafer having semiconductor elements on the front surface is to be processed, after the substrate and the front surface of the wafer are assembled together, the rear surface is processed. However, the elements (such as a pattern or holes) on the front surface may be damaged by pressure at the time of processing, or broken at the time of separation after processing. Particularly when the wafer after polishing is as thin as 10 to 200 μm, it may be broken and/or the elements may be broken at the time of separation. Although materials called "pressure sensitive adhesive" have been developed for temporary fixing for the same purpose, none of them can hold a workpiece firmly at the time of processing, can remove the workpiece easily, enables the removal and/or cleaning of an adhesive layer adhered to the workpiece, and is free from the destruction and contamination of semiconductor elements on the front surface.

Further, even when the thin wafer can be removed, it may be broken or deformed in the transportation step and/or the cleaning step after removal.

SUMMARY OF THE INVENTION

It is an object of the present invention to provide a temporary fixing agent with which one solid can be fixed to another solid firmly and the solids can be separated from each other easily thereafter, and a solid temporary fixing method and a separation method making use of the temporary fixing agent.

It is another object of the present invention to provide a temporary fixing agent suitably used for the processing of a semiconductor wafer, with which a semiconductor wafer can be held in such a manner that it is closely adhered and fixed to a hard plate, elastic carrier (backing) or substrate for a wafer or the like when it is to be processed, the wafer as a workpiece can be removed easily and a fixing agent layer adhered to the wafer can be removed and/or cleaned easily and which does not cause a contamination problem in the wafer as the workpiece, and a temporary fixing method and a separation method making use of the temporary fixing agent.

It is still another object of the present invention to provide a temporary fixing agent suitably used to temporarily fix a CMP pad, with which the CMP pad can be easily fixed on a base plate precisely and surely and can be removed easily when it is to be exchanged, and a method of temporarily fixing a CMP pad and a separation method making use of the temporary fixing agent.

It is a further object of the present invention to provide a method of processing a semiconductor wafer by fixing the semiconductor wafer to a CMP pad fixed on a base plate by the above method.

It is a still further object of the present invention to provide a method of processing the rear surface of a semiconductor wafer having semiconductor elements (a fine pattern or holes) on the front surface, which makes it possible to closely adhere and hold the wafer to a substrate when the rear surface of the semiconductor wafer is to be processed, prevents the breakage of the elements on the front surface when the rear surface is processed, enables the wafer as a workpiece to be removed easily and a fixing agent layer adhered to the wafer to be removed and/or cleaned easily, and is free from a contamination problem in the wafer as the workpiece.

It is a still further object of the present invention to provide a method of carrying a wafer without the breakage of elements on the front surface at the time of cleaning and without the breakage and/or deformation of the wafer by closely adhering and holding the wafer to an organic polymer particularly when the wafer after polishing is thin after the surface of the wafer is subjected to processing such as polishing.

Other objects and advantages of the present invention will become apparent from the following description.

According to the present invention, firstly, the above objects and advantages of the present invention are attained by a method of temporarily fixing two solids to each other with a liquid crystal compound or a composition comprising the liquid crystal compound.

According to the present invention, secondly, the above objects and advantages of the present invention are attained by a temporary fixing composition which comprises a liquid crystal compound as a temporary fixing agent for temporarily fixing two solids to each other.

According to the present invention, thirdly, the above objects and advantages of the present invention are attained by a method of temporarily fixing two solids to each other with a liquid crystal compound or a composition comprising the liquid crystal compound by contacting tightly the liquid crystal compound or the composition between the two solids.

According to the present invention, in the fourth place, the above objects and advantages of the present invention are attained by a method of separating two solids which have been temporarily fixed to each other by the above temporary fixing method of the present invention by melting a liquid crystal compound between them.

According to the present invention, in the fifth place, the above objects and advantages of the present invention are attained by a method of temporarily fixing a pad for chemical mechanical polishing, comprising:

(1) positioning a liquid crystal compound or a composition comprising the liquid crystal compound to a space between the surface of the pad for the chemical mechanical polishing of a wafer for a semiconductor device and the surface of a base plate for fixing the pad; and (2) heating at a temperature equal to or higher than the melting point of the liquid crystal compound and then cooling until the liquid crystal compound is solidified to fix the pad for chemical mechanical polishing on the surface of the base plate.

Further, according to the present invention, in the sixth place, the above objects and advantages of the present invention are attained by a method of processing a wafer for a semiconductor device, comprising:

(1) positioning a liquid crystal compound or a composition comprising the liquid crystal compound to a space between the surface of the wafer for a semiconductor device and the surface of a substrate for fixing the wafer;

(2) heating at a temperature equal to or higher than the melting point of the liquid crystal compound and then cooling until the liquid crystal compound is solidified to fix the wafer for a semiconductor device on the surface of the substrate;

(3) processing the exposed surface of the fixed wafer for a semiconductor device;

(4) heating the wafer for a semiconductor device at a temperature equal to or higher than the melting point of the liquid crystal compound to separate the wafer from the substrate; and (5) cleaning the separated wafer for a semiconductor device with a solvent which dissolves the liquid crystal compound or the composition comprising the liquid crystal compound.

DETAILED DESCRIPTION OF THE PREFERRED EMBODIMENTS

The present invention will be described in more detail hereinbelow.

The temporary fixing method of the present invention uses a liquid crystal compound or a composition comprising the liquid crystal compound as a temporary fixing agent for temporarily fixing two solids to each other.

The liquid crystal compound may be either what has a transition point from anisotropic crystal to isotropic crystal and a melting point for shifting from isotropic crystal to isotropic liquid or what has a melting point for shifting from anisotropic crystal to anisotropic liquid and a transparent point for shifting to anisotropic liquid and isotropic liquid. The expression "temporary fixing" as used in the present invention means that one solid is firmly fixed to another solid, processed and then separated from the other solid. It is preferred from this sense that a liquid crystal compound which is crystalline or solid at room temperature, specifically a liquid crystal compound having a melting point of 35° C. or higher be used in the present invention.

Examples of the liquid crystal compound which can be used in the present invention include sodium iso-butyrate, sodium oleate, potassium hexahydrobenzoate, sodium stearate, sodium myristate, sodium palmitate, sodium benzoate, ethyl-p-azoxybenzoate, 1-n-dodecylpyridinium chloride, 1-n-dodecylpyridinium bromide, 1-n-dodecylpyridinium iodide, 2-n-tridecylpyridinium chloride, 3-n-dodecyloxymethylpyridinium methyl sulfonate, 3-n-dodecyloxymethylpyridinium-p-methylphenyl sulfonate, 4-cyano-4'-octyloxybiphenyl, 4-cyano-4'-dodecyloxybiphenyl, 4-cyano-4'-octanoyloxybiphenyl, p-octyloxybenzoic acid-4-cyanophenyl ester, hepta-2,4-dienoic acid, octa-2,5-dienoic acid, nona-2,4-dienoic acid, deca-2,4-dienoic acid, undeca-2,4-dienoic acid, nona-2-en-4-oic acid, docosanoic acid (behenic acid), 1,12-dodecanedicarboxylic acid, p-n-butylbenzoic acid, p-n-amylbenzoic acid, p-n-hexyloxybenzoic acid, p-n-octyloxy-m-fluorobenzoic acid, ω-n-butylsorbic acid, p'-methoxy-p-biphenylcarboxylic acid, p-azoxyanisole, p-azoxyphenetole, anisylidene-p-aminophenyl acetate, p-methoxybenzylidene-p-butylaniline, p-ethoxybenzylidene-p-butylaniline, 5-chloro-6-n-propyloxy-2-naphthoic acid, 1-benzeneazo-anisal-4-naphthylamine, p-methoxy-p'-butylazoxybenzene, dihexyloxyazobenzene, p-hexylcarbonate-p'-heptyloxyphenylbenzoic acid, p-acetoxycinnamic acid, p-methoxy-α-cinnamic acid, phenylpentadienoic acid, p-n-hexyloxy-m-bromocinnamic acid, p-methoxy-p-biphenylcarboxylic acid, p'-ethoxy-m'-chloro-p-biphenylcarboxylic acid, p'-butyloxy-m'-bromo-p-biphenylcarboxylic acid, p'-n-propyloxy-m'-nitro-p-biphenylcarboxylic acid, 7-methoxy-2-fluorenic acid, 6-methoxy-2-naphthoic acid, 6-ethoxy-2-naphthoic acid, 6-n-propyloxy-5-chloro-2'-naphthoic acid, 6-n-propyloxy-5-bromo-2'-naphthoic acid, 6-n-butyloxy-5-chloro-2-naphthoic acid, 6-n-butyloxy-5-bromo-2-naphthoic acid, 6-n-butyloxy-5-iodo-2-naphthoic acid, p'-n-hexyloxy-p-biphenylcarboxylic acid methyl ester, p'-n-hexyloxy-p-biphenylcarboxylic acid ethyl ester, p'-n-hexyloxy-p-biphenylcarboxylic acid propyl ester, p'-n-dodecyloxy-m'-chlorobiphenylcarboxylic acid propyl ester, p'-n-dodecyloxy-m'-nitrobiphenylcarboxylic acid propyl ester, p,p'-biphenyldicarboxylic acid biphenyl ester, p,p'-terephenyldicarboxylic acid dimethyl ester, ethylene glycol bis(o-carboethoxy-p-oxyphenyl ester), bis(p-methoxycinnamyl)acetone diallylidenecyclopentanone-bis (p-methoxybenzal) cyclopentanone, diallylidenecyclohexanone-bis(p-methoxybenzal) cyclohexanone, bis[p-(benzoyloxy)benzal]-p-methylcyclohexanone, p,p'-bis(biphenylcarbinol)biphenyl, 1-chloro-1,2-bis(p-acetoxyphenyl)ethylene, p-acetoxybenzal-p'-methoxyaniline, p-methoxybenzal-p'-cyanoaniline, p-methoxybenzal-p'-methoxyaniline, p-methoxycinnamyl-p'-methylaniline, p-nitrocinnamyl-p'-methylaniline, p-methoxyphenylpentadienalaniline, benzal-p-aminobenzoic acid, p-cyanobenzal-p-aminobenzoic acid, benzal-p-amino(β-methyl)cinnamic acid, p-methoxybenzal-p-amino-o-methylcinnamic acid, p-methoxybenzal-p-amino-o-methylhydrocinnamic acid, p-ethoxybenzal-p-aminobenzoic acid ethyl ester, p-ethoxybenzal-p-aminocinnamic acid butyl ester, p-cyanobenzal-p-aminocinnamic acid ethyl ester, p-methylbenzal-p-aminocinnamic acid amyl ester, p-methoxybenzal-p-aminomethylcinnamic acid methyl ester, p-methoxybenzal-p-α-methylcinnamic acid propyl ester, p-ethoxybenzal-p-amino-α-ethylcinnamic acid ethyl ester, p-methoxycinnamyl-p-aminobenzoic acid ethyl ester, p-methoxybenzal-p-aminobiphenyl, benzal-p-amino-p'-acetylbiphenyl, benzal-p-amino-p'-dimethylaminobiphenol, benzal-p-amino-p'-formylaminobiphenyl, p-methylbenzal-p-amino-p'-acetylaminobiphenyl, p-methylbenzal-p-amino-p'-benzoylaminobiphenyl, cinnamyl-p-amino-p'-acetylbiphenyl, 2-p-methoxybenzalaminofluorene, 2-p-methoxybenzalaminophenanthrene, 2-p-methoxybenzalaminofluorene, 2-p-n-butyloxybenzalaminofluorene, p-nonyloxybenzalphenylhydrazine, bis(p-methoxybenzal)-(dimethyl)azine, bis(p-phenylbenzal)azine, p-methoxyphenylpentadienalphenylhydrazine, terephthal-bis-(p-chloroaniline), terephthal-bis(p-aminobenzoic acid ethyl ester), bis (p-chlorobenzal)-p-phenylenediamine, bis(p-methylbenzal)-p-toluylenediamine, dibenzal-p,p'-diaminobiphenyl, bis(o-oxybenzal)-p,p'-diaminobiphenyl, dicinnamyl-p,p'-diaminobiphenyl, bis(p-methoxybenzal)-p,p'-diaminodimethylbiphenyl, bis(p-methoxybenzal)-2,7-diaminofluorene, bis(p-methoxybenzal)-1,4-diaminonaphthalene, bis(p-methoxy-m-methylbenzal)-p,p'-diaminoterphenyl, dicinnamyl-p,p'-diaminoterphenyl, dibenzal-p,p'-diaminoquarterphenyl, p-methoxy-p'-oxyazobenzene, p,p'-dimethoxyazobenzene, p,p'-di-n-hexyloxyazobenzene, p-acetoxybenzene-p-azobenzoic acid ethyl ester, benzoyl-p-oxybenzene-p-azo-α-methylcinnamic acid amyl ester, p,p'-azobenzoic acid monoethyl ester, 1-acetoxynaphthalin-4-p-acetylazobenzene, benzal-p-aminoazobenzene, p-methoxybenzal-p-amino-p'-methylazobenzene, p-methoxybenzal-p-amino-p'-ethoxyazobenzene, cinnamyl-p-aminoazobenzene, p-methoxybenzal-1-aminonaphthalin-4-azobenzene, p-methoxybenzal-1-aminonaphthalin-4-(p'-acetylazobenzene), p-methylbenzal-1-aminonaphthalin-4-(p'-methoxyazobenzene), p-methylbenzal-1-aminonaphthalin-4-(p'-ethoxyazobenzene), p-methylbenzal-1-aminonaphthalin-4-(p'-azobenzoic acid ethyl ester), p-cinnamyl-1-aminonaphthalin-4-(p'-azobenzoic acid ethyl ester), bis(p-isopropylbenzal)-p,p'-diaminoazobenzene, (p-ethoxybenzene)-p-azo(p-methoxybenzoyl)-o-oxybenzal-(p'-ethoxy)aniline, p,p'-azobenzal-bis-aniline, benzal-p-aminobiphenylazobenzene, terephthal-bis(p-aminoazobenzene), p,p'-diacetoxyazoxybenzene, p,p'-dimethoxyazoxybenzene(azoxyanisole), p-methoxybenzene-p-azoxybenzoic acid methyl ester, p-methoxybenzene-p-azoxybenzoic acid phenyl ester, p,p'-azoxybenzoic acid dimethyl ester, p,p'-azoxythiobenzoic acid diethyl ester, p,p'-azoxycinnamic acid diheptyl ester, p,p'-azoxy-o-methylcinnamic acid dioctyl ester, p,p'-azoxy-o-methyl-β-bromocinnamic acid diethyl ester, p,p'-azoxy-β-methylcinnamic acid dimethyl ester, di-p-methoxybenzoyldisulfide, carbonic acid methyl cholesteryl ester, carbonic acid ethyl cholesteryl ester, benzoic acid-$\Delta^{5,6}$-cholesten-3β-01-ester, p-methoxybenzoic acid cholesteryl ester, p-aminobenzoic acid cholesteryl ester, p-n-heptylbenzoic acid-p'-cyanophenyl ester, 4-cyano-4'-pentyldicyclohexyl, 4-pentylcyclohexyl-1-carboxylic acid-p-cyanophenyl ester, 1-(p-cyanophenyl)-2-(4-pentylcyclohexyl)ethane, p-cyano-(4-heptyl-2,6-dioxacyclohexyl)benzene, p-cyano-(5-pentyl-2-pyrimidyl)benzene, p-cyano-[4-(3-pentenyl)cyclohexyl]benzene, 4-(p-cyanophenyl)-4'-heptylbicyclohexyl, p-cyano-(4-pentylcyclohexyl)benzene, 1-(p-cyanophenyl)-2-(4'-propyl-4-bicyclohexyl)ethane, p-(4-propylcyclohexyl)benzoic acid-2-cyano-4-pentylphenyl ester, p-(4-propylcyclohexyl)benzoic acid-2, 3-dicyano-4-pentyloxyphenyl ester, p-(3-pentyl-6-pyridazinyl)pentyloxybenzene, p-(1-cyano-4-propylcyclohexyl)-p'-pentylbiphenyl, 2,3-difluoro-4-ethoxy-4'-(4-pentylcyclohexyl)biphenyl, 4-(3,4-difluorophenyl)-4'-pentylbicyclohexyl, 1-[4-(3,4-difluorophenyl)cyclohexyl]-2-(4-pentylcyclohexyl)ethane, 3,4-difluoro-4'-(4-pentylcyclohexyl)biphenyl, cholesterol propionate, cholesterol benzoate, cholesterol palmitate, cholesterol chloride, cholesterol formate, cholesterol acetate, cholesterol pelargonate, p-aminocinnamic acid cholesteryl ester and benzoic acid-Δ5,6;7,8-cholestadiene-3β-01-ester; liquid crystal compounds showing composite conversion such as p-n-octyloxybenzoic acid, p-n-octyloxy-m-chlorobenzoic acid, p-n-dodecyloxybenzoic acid, 5-chloro-6-n-heptyloxy-2-naphthoic acid, p-n-nonyloxybenzal-p'-toluidine, cholesterol myristate, cholesterol octanoate, p-n-nonyloxy-m-fluorobenzoic acid, 5-iodo-6-n-nonyl-2-naphthoic acid, n-nonanoic acid cholesterol, p'-n-hexyloxy-m'-nitro-p-biphenylcarboxylic acid, p-n-hexyloxy-m-chlorocinnamic acid, p-amyloxy-p-biphenylcarboxylic acid, p'-butyloxy-m'-chloro-p-biphenylcarboxylic acid, p'-n-hexyloxy-m'-nitro-p-biphenylcarboxylic acid, 7-n-heptyloxy-2-fluorenic acid, 6-n-nonyloxy-5-iodo-2-naphthoic acid, 6-n-nonyloxy-5-nitro-2-naphthoic acid, 7-n-heptyloxy-2-fluorenic acid propyl ester, 2-acetyl-7-n-heptyloxy-lfluorene, di-p,p'-ethyl-3,6-biphenylpyridazine, dimethyl-p,p'-dioxyterphenyl, p,p'-diaminoquaterphenylquinquephenyl, p-n-nonyloxybenzal-p'-ethylaniline, p-n-nonyloxybenzal-p'-propylaniline, p-hexyloxybenzal-p-aminocinnamic acid ethyl ester, p-methoxybenzal-p-aminocinnamic acid amyl ester, 2-p-n-hexyloxybenzalaminophenanthrene, p-ethoxybenzal-p-aminoterphenyl, bis(p-aminooxybenzal)-p'-phenylenediamine, bis(p-n-butyloxybenzal)-p,p'-diaminobiphenyl, bis(p-propoxybenzal)-2,7-diaminofluorene, bis(p-pentyloxybenzal)-2,7-diaminofluorene, dibenzal-p,p'-diaminoterphenyl, p-methoxybenzene-p-azocinnamic acid ethyl ester, p,p'-azocinnamic acid dimethyl ester, (benzoyl)-p-oxy-m-methoxybenzene-p'-acetylazobenzene, (benzoyl)-p-oxy-o-methoxybenzene-p'-acetylazobenzene, (benzoyl)-p-oxy-o-ethoxybenzene-p'-acetylazobenzene, p,p'-dihexyloxyazoxybenzene, p-ethoxybenzene-p-azoxythiobenzoic acid ethyl ester, p-ethoxybenzene-p-azoxybenzoic acid (p-ethyl)phenyl ester, bis(p-ethoxybenzene-p-azoxybenzoic acid)-m-dioxybenzene ester, 4-(p-fluorophenyl)-4'-pentylbicyclohexyl, 1-(3,4-difluorophenyl)-2-[4-(4'-pentylbicyclohexyl)]ethane, 4-(p-trifluoromethoxyphenyl)-4'-pentylbicyclohexyl, 4-(p-difluoromethoxyphenyl)-4'-pentylbicyclohexyl, 4-trifluoromethoxy-4'-(4-pentylcyclohexyl)biphenyl and p-trifluoromethoxyphenyl-p-(4-pentylcyclohexyl)phenyacetylene; discotic liquid crystals such as a compound having a steroid ester group at the 1-, 3- and 5-positions of one benzene ring; and polymer liquid crystal compounds having liquid crystallinity such as aromatic polyesters, polyamides and polyimides.

These liquid crystal compounds may be used alone or in combination of two or more. Out of these liquid crystal compounds, liquid crystal compounds and mixtures of two or more liquid crystal compounds having a melting point of 35 to 200° C. are preferred, and those having a melting point of 40 to 150° C. are more preferred. Further, the liquid crystal compound may be used as a solution containing a solvent.

In the present invention, the liquid crystal compound may be mixed with an organic polymer to be used as a composition in order to adjust its melting point.

Examples of the organic polymer include poly(azelaic anhydride), poly[2,6-bis(hydroxymethyl)-4-methylphenol-co-4-hydroxybenzoic acid], poly(1,4-butanediol)bis(4-aminobenzoate), poly(1-butene), 1,6-diisocyanate hexane reaction product of poly(1,4-buteneadipate-co-1,4-butylenesuccinate), poly(1,4-butyleneadipate)diol, poly(1,4-butyleneadipate-co-polycaprolactam), 1,6-diisocyanate hexane reaction product of poly(1,4-butylenesuccinate), poly[butyleneterephthalate-co-poly(alkylene glycol)terephthalate], polycaprolactone diol, polycarbomethylsilane, polychloroprene, poly(chlorotrifluoroethylene-co-vinylidene fluoride), poly[(o-cresylglycidyl ether)-co-formaldehyde], poly[dimethylsiloxane-co-methyl(stearoyloxyalkyl) siloxane], polyethylene, poly(ethylene-co-acrylic acid), sodium or zinc salt of poly(ethylene-co-acrylic acid), tolylene-2,4-diisocyanate reaction product of poly(ethylene adipate), poly(ethylene azelate), poly(ethylene-co-1-butene), poly(ethylene-co-1-butene-co-1-hexene), poly(ethylene-co-butyl acrylate-co-carbon monoxide), poly(ethylene-co-butyl acrylate-co-maleic anhydride), poly(ethylene-co-butylene)diol, poly(ethylene-co-ethyl acrylate), poly(ethylene-co-ethyl acrylate-co-maleic anhydride), poly(ethylene-co-glycidyl methacrylate), poly(ethylene glycol), sodium, lithium or zinc salt of polyethylene-graft-maleic anhydride, poly(ethylene-co-methacrylic acid) or poly(ethylene-co-methacrylic acid), poly(ethylene-co-methyl acrylate), poly(ethylene-co-methyl acrylate-co-acrylic acid), polyethylene monoalcohol, poly(ethylene-co-1-octene), polyethylene oxide, polyethylene-block-poly(ethylene glycol), poly(ethylene succinate), poly(ethylene-co-trialkoxyvinylsilane), poly(ethylene-co-vinyl acetate), poly(hexafluoropropylene oxide-co-difluoromethylene oxide) monoalkylamide, poly(1,6-hexamethylene adipate), poly(hexamethylene carbonate), poly(3-hydroxybutanoic acid), polyisoprene, polymethyl methacrylate, polylauryl lactam-block-polytetrahydrofuran, poly(oxymethylene)acetate, polypropylene, poly(1,3-propylene adipate), polypropylene oxide, polyphenylene oxide, poly(propylene-co-1-butene), poly(propylene-co-ethylene), poly(1,3-propylene glutarate), poly(1,3-propylene succinate), poly(sebacic anhydride), polystyrene, poly(vinyl alcohol-co-ethylene), polyvinylidene chloride, poly(vinylidene chloride-co-methyl acrylate), poly(vinylidene chloride-co-vinyl chloride), poly(vinylidene fluoride), poly(vinylidene fluoride-co-hexafluoropropylene), poly(vinyl-N-octadecyl carbamate), poly(vinyltoluene-co-α-methylstyrene), poly(bisphenol A-co-4,4'-dichlorodiphenyl sulfone), phenolic resin, urea resin, melamine resin, unsaturated polyester resin, epoxy resin and polyurethane.

These organic polymers may be used alone or in combination of two or more. Out of these organic polymers, organic polymers and mixture of two or more organic polymers having a melting point of 35 to 200° C. are preferred, and those having a melting point of 40 to 150° C. are more preferred.

The amount of the organic polymer, which depends on the melting points of the liquid crystal compound and the organic polymer is preferably 1 to 200 wt %, more preferably 5 to 150 wt % based on the liquid crystal compound.

In the present invention, the liquid crystal compound or the composition comprising the liquid crystal compound may be suitably mixed with fine particles of a metal oxide such as aluminum oxide, zirconium oxide, titanium oxide or silicon oxide as required to adjust its viscosity when it is molten by heating. Further, the liquid crystal compound or the composition comprising the liquid crystal compound may be mixed with an organic polymer having a melting point higher than 200° C. as required to adjust its viscosity when it is molten by heating.

Examples of the organic polymer having a melting point higher than 200° C. include polystyrene, polyvinyl chloride, poly(ethylene-alt-chlorotrifluoroethylene), poly(ethylene-co-ethyl acrylate-co-maleic anhydride), poly(ethylene-alt-maleic anhydride), poly(ethylene-co-tetrafluoroethylene), poly(ethylene-co-vinyl acetate), poly(isobutylene-co-maleic anhydride), polyvinyl alcohol, polyvinyl acetal, polyacrylonitrile, polytetrafluoroethylene, polychlorotrifluoroethylene, polyethylene fluoride, nylon-6, nylon-8, nylon-6,6, polyethylene terephthalate, polybutylene terephthalate, poly[butylene terephthalate-co-(polyalkylene glycol)terephthalate], polycarbomethylsilane, poly(2,6-dimethyl-1,4-phenylene oxide), polycarbonate, poly-p-xylylene, poly(benzenetetracarboxylic dianhydride-co-4,4'-diaminodiphenyl ether), poly(benzenetetracarboxylic dianhydride-co-4,4'-diaminodiphenylmethane), poly(trimellitic anhydride chloride-co-4,4'-methylenedianiline), polybenzimidazole, polyacenaphthylene, polyglycolide, polylauryl lactam-block-polytetrahydrofuran, poly(4-vinylphenol-co-methyl methacrylate), poly(4-methyl-1-pentene) and polyphenyl sulfone.

The amount of the organic polymer having a melting point higher than 200° C., which depends on the melting point of the liquid crystal compound and the melting points of the liquid crystal compound and the organic polymer, is preferably 200 wt % or less, more preferably 150 wt % or less based on the liquid crystal compound.

In the present invention, in order to improve the wettability and/or fixability of two solids to be fixed to each other, a small amount of a surface tension control agent such as a fluorine-based, silicone-based or nonionic surfactant may be mixed with the liquid crystal compound or the composition comprising the liquid crystal compound in limits that do not impair the targeted function. Examples of the nonionic surfactant include fluorine-based surfactants having a fluoroalkyl group or perfluoroalkyl group and polyether alkyl-based surfactants having an oxyalkyl group. The fluorine-based surfactants include $C_9F_{19}CONHC_{12}H_{25}$, $C_8F_{17}SO_2NH—(C_2H_4)_6H$, $C_9F_{17}O$(Pululonic L-35) $C_9F_{17}$ and $C_9F_{17}O$(Pululonic P-84)$C_9F_{17}$ (Pululonic L-35: polyoxypropylene-polyoxyethylene block copolymer having an average molecular weight of 1,900 manufactured by Asahi Denka Kogyo K.K.; Pululonic P-84:
polyoxypropylene-polyoxyethylene block copolymer having an average molecular weight of 4,200 manufactured by Asahi Denka Kogyo K.K.; Tetronic-704:
N,N,N',N'-tetrakis(polyoxypropylene-polyoxyethylene block copolymer manufactured by Asahi Denka Kogyo K.K.). Illustrative examples of the fluorine-based surfactants include F Top EF301, EF303 and EF352 (of Shin Akita Kasei Co., Ltd.), Megafac F171 and F173 (of Dainippon Ink and Chemicals, Inc.), Asahi Guard AG710 (of Asahi Glass Co., Ltd.), Florade FC-170C, FC430 and FC431 (of Sumitomo 3M Limited), Surflon S-382, SC101, SC102, SC103, SC104, SC105 and SC106 (of Asahi Glass Co., Ltd.), BM-1000 and -1100 (of B. M-Chemie Co., Ltd.), and Schsego-Fluor (of Schwegmann Co., Ltd.).

The polyether alkyl-based surfactants include polyoxyethylene alkyl ethers, polyoxyethylene allyl ethers, polyoxyethylene alkyl phenyl ethers, polyoxyethylene fatty acid esters, sorbitan fatty acid esters, polyoxyethylene sorbitan fatty acid esters and oxyethylene oxypropylene block polymers. Illustrative examples of the polyether alkyl-based surfactants include Emalgen 105, 430, 810 and 920, Reodol SP-40S and TW-L120, Emanol 3199 and 4110, Exel P-40S, Bridge 30, 52, 72 and 92, Arassel 20, Emasol320, Tween 20 and 60, and Marge 45 (of Kao Corporation) and Noniball 55 (of Sanyo Chemical Industries, Ltd.).

Other nonionic surfactants include polyoxyethylene fatty acid esters, polyoxyethylene sorbitan fatty acid esters and polyalkylene oxide block copolymers, as exemplified by Chemistat 2500 (of Sanyo Chemical Industries, Ltd.), SN-EX9228 (of Sun Nopco, Co., Ltd.) and Nonal 530 (of Toho Kagaku Kogyo Co., Ltd.).

As described above, the liquid crystal compound as a temporary fixing agent in the present invention is used alone, as a mixture of two or more liquid crystal compounds, or as a composition comprising a liquid crystal compound and optionally added additives. The temporary fixing agent may be used as it is, dissolved or dispersed in a suitable solvent in a liquid form, or molded into a pellet or film before use.

Any solvent is acceptable if it dissolves the liquid crystal compound or both of the liquid crystal compound and the organic polymer. Examples of the solvent include alcohols such as isopropanol, butanol, hexanol, octanol, decanol, undecanol, benzyl alcohol, ethylene glycol, diethylene glycol, propylene glycol, dipropylene glycol and phenol; hydrocarbon-based solvents such as n-pentane, cyclopentane, n-hexane, cyclohexane, n-heptane, cycloheptane, n-octane, cyclooctane, n-decane, cyclodecane, dicyclopentadiene hydride, benzene, toluene, xylene, durene, indene, decalin, tetralin, tetrahydronaphthalene, decahydronaphthalene, squalane, ethylbenzene, t-butylbenzene and trimethylbenzene; ketones such as acetone, methyl ethyl ketone, methyl isobutyl ketone, cyclopentanone and cyclohexanone; ethers such as ethyl ether, ethylene glycol dimethyl ether, ethylene glycol diethyl ether, diethylene glycol dimethyl ether, diethylene glycol diethyl ether, tetrahydrofuran and dioxane; esters such as ethyl acetate, butyl acetate, ethyl butyrate, ethylene glycol monomethyl ether acetate, ethylene glycol monoethyl ether acetate, ethylene glycol monoacetate, diethylene glycol monomethyl ether acetate, diethylene glycol monoethyl ether acetate, propylene glycol monomethyl ether acetate, propylene glycol monoethyl ether acetate, dipropylene glycol monomethyl ether acetate and dipropylene glycol monoethyl ether acetate; and polar solvents such as dimethylformamide, dimethylacetamide, N-methylpyrrolidone, hexamethylphosphoramide, dimethyl sulfoxide, γ-butyrolactone, chloroform and methylene chloride. These solvents may be used alone or in combination of two or more.

When the temporary fixing agent of the present invention is molded into a pellet, a known technique such as injection molding, casting molding, casting or film cutting may be used. When the pellet is formed by injection molding or cast molding, the temperature is preferably the melting point of the liquid crystal compound or the composition comprising the liquid crystal compound and the organic polymer as a temporary fixing agent to (melting point +300° C.), more preferably (melting point +5° C.) to (melting point +250° C.), particularly preferably (melting point +10° C.) to (melting point +200° C.). The cast molding time is, for example, 1 to 120 minutes, preferably 2 to 90 minutes more preferably 50 to 60 minutes. The solvent scattering temperature at the time of casting, which depends on the boiling point of the used solvent, is preferably the boiling point of the solvent to (boiling point of solvent +200° C.), more preferably (boiling point of solvent +5° C.) to (boiling point of solvent +150° C.), particularly preferably (boiling point of solvent +10° C.) to (boiling point of solvent +100° C.).

The form of the pellet is not particularly limited and may be columnar or polygonal pillar-like such as trigonal pillar-like, tetragonal pillar-like, pentagonal pillar-like or hexagonal pillar-like, conical or polygonal pyramid-like such as trigonal pyramid-like, tetragonal pyramid-like, pentagonal pyramid-like or hexagonal pyramid-like, football-like, or polyhedron such as a cube. Out of these, a columnar or polygonal pillar-like form is preferred to keep the space between the fixed surfaces of two solids to be temporarily fixed to each other horizontally, and a columnar form is particularly preferred from the viewpoint of the production ease of a pellet.

When the temporary fixing agent of the present invention is molded into a film, a composition which is a solution comprising a liquid crystal compound, an organic polymer and a solvent is molded into a film. The film, whose form depends on the melting points of the liquid crystal compound and the organic polymer used, may be a film formed by scattering the solvent from the composition or a so-called dry film, that is, a three-layer film comprising the above film sandwiched between a base film and a cover film.

When a dry film is used, the base film may be a film of polyethylene terephthalate, polyether sulfone, polyimide or polypropylene. The thickness of the base film is preferably 10 to 200 μm. The cover film may be the same as the base film or a polyethylene film. The thickness of the cover film is preferably 5 to 100 μm, more preferably 10 to 50 μm.

The method of manufacturing this film is not particularly limited. The above composition is applied to a glass, an organic polymer, ceramic or metal substrate by brushing, bar coating, applicator coating, spin coating, dip coating, printing or curtain coating and heated to scatter the solvent, or a composition containing no solvent is applied under heating to form a film.

For the formation of a film, the composition contains the liquid crystal compound and the organic polymer in a total amount of preferably 0.1 to 100 wt %, more preferably 0.5 to 80 wt %, particularly preferably 1 to 50 wt % although the total amount depends on the thickness of the film. The temperature for scattering the solvent after application ranges from room temperature to preferably 200° C., more preferably 150° C., much more preferably 100° C. when a composition containing a solvent is used. When a composition containing no solvent is used, the temperature is suitably selected according to the melting points of the liquid crystal compound and the organic polymer used. That is, the composition is heated at a temperature equal to or higher than the melting points of the liquid crystal compound and the organic polymer and applied to a substrate.

The dry film is formed by applying the composition to the base film on a glass, organic polymer, ceramic or metal substrate by brushing, bar coating, applicator coating, spin coating, dip coating, printing or curtain coating, heating to scatter the solvent, drying to form a film of the composition and covering it with the above cover film.

According to the method of the present invention, two solids can be fixed to each other temporarily with the above liquid crystal compound or the composition comprising the liquid crystal compound as a temporary fixing agent. That is, the liquid crystal compound or the composition comprising the liquid crystal compound is contacted tightly between the two solids so that the two solids can be temporarily fixed to each other with the liquid crystal compound or the composition comprising the liquid crystal compound.

In order to contact tightly the temporary fixing agent between the two solids, preferably, the temporary fixing agent in the form of a powder, pellet or film is heated at a temperature equal to or higher than the melting point of the liquid crystal compound to be molten and then cooled to a temperature lower than the melting point, or the temporary fixing agent in the form of a solution is positioned between the two solids by application, the solvent is then removed from the solution between the two solids, and the agent is further heated to be molten as required and then cooled. To melt the temporary fixing agent between the two solids, preferably, after at least one of the solids is heated at a temperature equal to or higher than the melting point of the liquid crystal compound used as the temporary fixing agent or the melting points of the liquid crystal compound and the organic polymer, the two solids are press contacted to each other to be assembled together with the temporary fixing agent therebetween. This assembling temperature, which depends on the melting point of the liquid crystal compound used as the temporary fixing agent or the melting points of the liquid crystal compound and the organic polymer, is (melting point of liquid crystal compound or melting points of liquid crystal compound and organic polymer) to (melting point +300° C.), preferably (melting point +5° C.) to (melting point +250° C.), more preferably (melting point +10° C.) to (melting point +200° C.). The assembling time is preferably 1 to 120 minutes, more preferably 2 to 90 minutes, particularly preferably 5 to 60 minutes.

The amount of the temporary fixing agent depends on the size of the bonding surface of a solid used and can be suitably selected. The thickness of the temporary fixing agent layer formed between the two solids is preferably 0.01 μm to 20 mm, more preferably 0.05 μm to 10 mm, particularly preferably 0.1 μm to 5 mm.

The pressure for assembling two solids together is not particularly limited. Any pressure is acceptable if adhesion which can stand from the processing step to treatment step to be carried out subsequently and described below is obtained. It can be suitably selected according to the liquid crystal compound or a combination of the liquid crystal compound and the organic polymer.

The materials of the two solids to be fixed to each other are not particularly limited. Examples of the materials include metals, glass, ceramics, porcelain, plastics, rubber, wood, paper and cloth. The materials of the two solids to be fixed to each other may be the same or different.

The two solids which have been fixed to each other and subjected to a predetermined processing to treatment step are separated from each other by melting the liquid crystal compound therebetween. It is preferred that at least one of the two solids be heated to melt the liquid crystal compound and separated from the other solid. The heating temperature for separating the solids is equal to or higher than the melting point of the liquid crystal compound used as the solid fixing agent or the melting points of the liquid crystal compound and the organic polymer, preferably (melting point +5° C.) to (melting point +150° C.), more preferably (melting point +10° C.) to (melting point +100° C.).

When the temporary fixing agent remains on the surface which has been fixed after separation, it can be removed by cleaning with a solvent. The solvent which can be used for cleaning may be a solvent which dissolves the liquid crystal compound or both the liquid crystal compound and the organic polymer. More specifically, the solvent which can be used to dissolve the temporary fixing agent is the same as those listed above. In addition, an aqueous solution of an inorganic alkali such as potassium hydroxide, aqueous solution of an organic base such as tetramethylammonium hydroxide, aqueous solution of an inorganic acid such as hydrochloric acid, or aqueous solution of an organic acid such as acetic acid may also be used. These aqueous solutions of an inorganic or organic compound may contain a suitable water-soluble organic solvent such as methanol, ethanol, isopropyl alcohol, butanol, dioxane, tetrahydrofuran, dimethyl sulfoxide or γ-butyrolactone as required.

Preferred embodiments of the present invention will be described hereinbelow. Embodiments of the present invention will be understood more widely and in more detail by the following description.

According to one of the embodiments of the present invention, the two solids are a pad for the chemical mechanical polishing of a wafer for a semiconductor device and a base plate for fixing the pad. In this case, according to the present invention, there is provided a method of temporarily fixing a pad for chemical mechanical polishing, comprising:
(1) positioning a liquid crystal compound or a composition comprising the liquid crystal compound between the surface of the pad for the chemical mechanical polishing of a wafer for a semiconductor device and the surface of a base plate for fixing the pad; and
(2) heating at a temperature equal to or higher than the melting point of the liquid crystal compound and cooling until the liquid crystal compound is solidified in order to fix the pad for chemical mechanical polishing on the surface of the base plate.

The term "chemical mechanical polishing" may be abbreviated as CMP hereinafter.

In the step (1), the temporary fixing agent which is the liquid crystal compound or the composition comprising the liquid crystal compound is positioned between the surface of the CMP pad and the surface of the base plate. In the subsequent step (2), the temporary fixing agent is heated to be molten and then cooled to be solidified to fix the pad on the base plate.

In the step (1), the method of positioning the temporary fixing agent between the surface of the CMP pad and the surface of the base plate is not particularly limited. In general, the temporary fixing agent is positioned on the CMP pad and/or the base plate by suitable means such as spraying, applying or placing, and then the surface of the CMP pad and the surface of the base plate are assembled together. The methods have been described in detail above. Out of these, the step (1) is preferably carried out by spraying the liquid crystal compound or the composition comprising the liquid crystal compound as a solid powder on the surface of at least one of the CMP pad for a wafer for a semiconductor device and the base plate for fixing the pad, by placing the liquid crystal compound or the composition comprising the liquid crystal compound as a pellet or film, or by applying the liquid crystal compound or the composition comprising the liquid crystal compound as a solution containing a solvent and then removing the solvent.

The CMP pad is not particularly limited and may be a commercially available nonwoven fabric pad, suede pad, artificial leather pad, foamed pad or composite pad comprising a sponge layer. These pads may be made from polyurethane, polyester resin, polyamide, butadiene-based rubber or EPDM. The pad may be a lamellar or nonwoven fabric pad made from one or more of the above materials.

After the temporary fixing agent is positioned between the CMP pad and the base plate, it is heated to be molten and then cooled to be solidified in order to fix the CMP pad on the base plate in the step (2). Preferably, at least one of the CMP pad and the base plate is heated at a temperature equal to or higher than the melting point of the liquid crystal compound used as the temporary fixing agent or the melting points of the liquid crystal compound and the organic polymer and press contacted to the other solid to be assembled together. The assembling temperature, which depends on the melting point of the liquid crystal compound used as the temporary fixing agent or the melting points of the liquid crystal compound and the organic polymer, is preferably (melting point of liquid crystal compound or melting points of liquid crystal compound and organic polymer) to (melting point +300° C.), more preferably (melting point +5° C.) to (melting point +250° C.), particularly preferably (melting point +10° C.) to (melting point +200° C.). The assembling time is preferably 1 to 120 minutes, more preferably 2 to 90 minutes, particularly preferably 5 to 60 minutes.

The amount of the temporary fixing agent, which depends on the size of the bonding surface of the CMP pad used, can be suitably selected to ensure that the thickness of the temporary fixing agent layer formed between the pad and the base plate is preferably 0.01 µm to 20 mm, more preferably 0.05 µm to 10 mm, particularly preferably 0.1 µm to 5 mm.

The pressure for assembling the CMP pad with the base plate is not particularly limited if adhesion which can stand the chemical mechanical polishing step to be carried out subsequently is obtained and can be suitably selected according to the liquid crystal compound or a combination of the liquid crystal compound and the organic polymer.

The processing of the wafer for a semiconductor device can be carried out in an ordinary chemical mechanical polishing step using the CMP pad fixed on the base plate. The chemical mechanical polishing step is preferably carried out at a temperature lower than the melting point of the liquid crystal compound or the melting points of the liquid crystal compound and the organic polymer.

The chemical mechanical polishing step can be carried out by a known technique using a suitable chemical mechanical polishing slurry under suitable conditions.

The CMP pad used in the chemical mechanical polishing step and fixed on the base plate as described above must be removed and exchanged with a new pad after a predetermined number of wafers have been polished. In this removing step, at least one of the CMP pad and the base plate is preferably heated and removed. The heating temperature for removal is preferably equal to or higher than the melting point of the liquid crystal compound used as the temporary fixing agent or the melting points of the liquid crystal compound and the organic polymer, more preferably (melting point +5° C.) to (melting point +150° C.), particularly preferably (melting point +10° C.) to (melting point +100° C.).

If the temporary fixing agent remains on the base plate after the CMP pad is removed, it can be removed by cleaning with a solvent. The solvent which can be used for cleaning has been mentioned above. As for what is not described of the method of temporarily fixing the CMP pad, it should be understood that the above description is applied directly or with modifications obvious to one of ordinary skill in the art.

According to another embodiment of the present invention, the two solids are a wafer for a semiconductor device and a substrate for fixing the wafer.

In this case, according to the present invention, there is provided a method of processing a wafer for a semiconductor device, comprising:
(1) positioning a liquid crystal compound or a composition comprising the liquid crystal compound between the surface of the wafer for a semiconductor device and the surface of a substrate for fixing the wafer;
(2) heating at a temperature equal to or higher than the melting point of the liquid crystal compound and then cooling until the liquid crystal compound is solidified to fix the wafer for a semiconductor device to the surface of the substrate;
(3) processing the exposed surface of the fixed wafer for a semiconductor device;

(4) heating the wafer for a semiconductor device at a temperature equal to or higher than the melting point of the liquid crystal compound to separate it from the substrate; and (5) cleaning the separated wafer for a semiconductor device with a solvent which dissolves the liquid crystal compound or the composition comprising the liquid crystal compound.

The step (1) can be carried out by spraying the liquid crystal compound or the composition comprising the liquid crystal compound as a solid powder on the surface of at least one of the wafer for a semiconductor device and the substrate for fixing the wafer, placing it on the surface as a pellet or film, or applying it to the surface as a solution containing a solvent and then removing the solvent.

In the case of application, the application technique is not particularly limited and may be spin coating, dip coating, curtain coating, roll coating, spray coating, ink jet coating or printing. The temporary fixing agent may be applied once or a plurality of times. The thickness of a suitable thin film layer formed by applying the temporary fixing agent and scattering the solvent is suitably changed by the application technique and the concentration of the liquid crystal compound in the solution composition. The thickness of the thin film layer is preferably 0.001 to 100 μm, more preferably 0.005 to 50 μm. Drying for scattering the solvent may be carried out by leaving at room temperature or by heating. To scatter the solvent by heating, drying is carried out at a temperature of preferably (melting point of liquid crystal compound used in solution composition) to (melting point +200° C.), more preferably (melting point +5° C.) to (melting point +150° C.), particularly preferably (melting point +10° C.) to (melting point +100° C.).

In this case, the temperature of the composition to be applied is set equal to or higher than the melting point of the liquid crystal compound, thereby making easy drying after application.

In the subsequent step (2), at least one of the wafer for a semiconductor device and the substrate for fixing the wafer as a solid having a thin film of the liquid crystal compound formed on the surface is heated at a temperature equal to or higher than the melting point of the liquid crystal compound and then cooled to solidify the liquid crystal compound, whereby it is closely adhered and fixed to the other solid. To this end, the both solids are preferably assembled together while heated at a temperature equal to or higher than the melting point of the liquid crystal compound. This assembling temperature is preferably (melting point +5° C.) to (meting point +150° C.), more preferably (melting point +10° C.) to (melting point +100° C.).

The pressure for assembling the wafer as a workpiece with the substrate for the wafer is not particularly limited if adhesion which can stand the processing of the wafer as the workpiece is obtained and can be suitably selected according to the liquid crystal compound used.

The wafer assembled with the substrate for supporting the wafer is subjected to specific processing according to the use purpose of the wafer in the step (3). For example, when the exposed surface of the wafer for a semiconductor device is the rear surface having no semiconductor elements of the wafer in the step (3), the processing may be the polishing of this rear surface. According to circumstances, the wafer assembled with the substrate for the wafer may be carried. In either case, the wafer is processed at a temperature lower than the melting point of the liquid crystal compound according to its use purpose. After the processing is over, the wafer and the substrate are separated from each other in the step (4) by heating at least one of the wafer as the workpiece and the substrate for the wafer. The temperature for separating the wafer from the substrate is equal to or higher than the melting point, preferably (melting point +5° C.) to (melting point +150° C.), more preferably (melting point +10° C.) to (melting point +100° C.).

In the subsequent step (5), the separated wafer is cleaned with a solvent which can dissolve the liquid crystal compound to remove the liquid crystal compound. A step known per se may be added and suitably carried out as required in addition to the above steps (1) to (5).

For example, when the processing in the step (3) is the polishing of the rear surface of the wafer, the step (3') of affixing a dicing tape to the polished rear surface of the wafer for a semiconductor device is carried out between the step (3) and the step (4), and then the wafer for a semiconductor device can be separated from the substrate together with the dicing tape in the step (4). Thereafter, the wafer for a semiconductor device is cleaned together with the dicing tape in the step (5) and the step (6) of dicing the wafer for a semiconductor device to which the dicing tape has been affixed can be further carried out after the step (5).

For example, when the processing in the step (3) is the polishing of the rear surface of the wafer as well, the step (3") of temporarily fixing an organic polymer film to the polished rear surface of the wafer for a semiconductor device with the liquid crystal compound or the composition comprising the liquid crystal compound is carried out between the step (3) and the step (4), and then the wafer for a semiconductor device can be separated from the substrate together with the organic polymer film in the step (4).

Subsequently, the wafer for a semiconductor device is cleaned while the organic polymer film is fixed to the wafer in the step (5) and the step (6') of dicing the wafer for a semiconductor device to which the organic polymer film has been fixed can be further carried out after the step (5).

The dicing tape used in the above step (3') is not particularly limited and may be a commercially available general dicing tape.

The dicing tape may be ultraviolet light curable or non-ultraviolet light curable, as exemplified by Dicing Tape UC-110M-120, UC-120M-120, UC-128M-90, UC-228W-110, UC-353EP-110, UC-334EP-85, UC-337EP-110, UC-321EP-85, UC-329EP-85, FC-217M-170 and FC-220M-120 of the Furukawa Electric Co., Ltd., Riva Alpha No. 3193M, 3193MS, 3194M, 3194MS, 3194H, 3194HS, 3195, 3195M, 3195MS, 3195H, 3195HS, 3196, 3198LS, 3198M, 3198MS, 3198H and 3198HS of Nitto Denko Corporation, and Dicing Tape Sumirice-FSL and FSL-N4000 of Sumitomo Bakelite Co., Ltd.

After the dicing tape is affixed to the polished surface in the above step (3'), the wafer to which the dicing tape has been affixed is separated from the substrate by heating at a temperature equal to or higher than the melting point of the liquid crystal compound in the step (4). Therefore, a dicing tape having heat resistance to the above heating temperature is selected. The temperature and pressure for affixing the dicing tape are suitably selected according to the specifications of the selected dicing tape.

The wafer to which the dicing tape has been affixed is diced in the step (6). The dicing method and cleaning after dicing are suitable selected according to purpose and not particularly limited.

A description is subsequently given of the step (3"). In the step (3"), the organic polymer film is temporarily fixed to the polished rear surface of the wafer for a semiconductor device with the liquid crystal compound or the composition comprising the liquid crystal compound. Thereafter, in the step (4), the wafer for a semiconductor device is separated from the substrate together with the organic polymer film. In the subsequent step (5), the wafer for a semiconductor device can be cleaned while the organic polymer film is fixed to the wafer, and then the dicing step (6) can be further carried out.

It can be understood that after the step (4), the step (5) or the step (6), the wafer for a semiconductor device can be moved (carried) to another place together with the organic polymer film. The place is suitably selected according to purpose and not particularly limited. The dicing method in the step (6) and the subsequent cleaning are suitably carried out according to purpose.

The material of the organic polymer film used in the step (3″) is not particularly limited and may be a commercially available general organic polymer. That is, the organic polymer film which can be used in the present invention may be any organic polymer film if it can withstand the temporary fixing agent chemically and the melting temperature of the agent. Examples of the material of the organic polymer film include polyvinyl chloride, polyvinyl alcohol, polyvinyl acetate, polyethylene, polypropylene, polyethylene terephthalate, polyether sulfone, polyimide, poly-1,2-butadiene and cyclic olefin-based polymer.

Examples of a monomer forming the above cyclic olefin-based polymer include tricyclo[4.3.0.1$^{2,5}$]dec-3-ene, 1-methyltricyclo[4.3.0.1$^{2,5}$]dec-3-ene, 1-methoxytricyclo[4.3.0.1$^{2,5}$]dec-3-ene, 2-methyltricyclo[4.3.0.1$^{2,5}$] dec-3-ene, 5-methyltricyclo[4.3.0.1$^{2,5}$]dec-3-ene, 6-methyltricyclo[4.3.0.1$^{2,5}$]dec-3-ene, 6-ethyltricyclo[4.3.0.1$^{2,5}$]dec-3-ene, 9-methyltricyclo[4.3.0.1$^{2,5}$]dec-3-ene, 9-ethyltricyclo[4.3.0.1$^{2,5}$]dec-3-ene, 10-methyltricyclo[4.3.0.1$^{2,5}$]dec-3-ene, 10-ethyltricyclo[4.3.0.1$^{2,5}$]dec-3-ene, 10-phenyltricyclo[4.3.0.1$^{2,5}$]dec-3-ene, 10-cyclohexyltricyclo[4.3.0.1$^{2,5}$]dec-3-ene, tricyclo[4.2.0.1$^{2,5}$]non-2-ene, 2-methyltricyclo[4.2.0.1$^{2,5}$]non-3-ene, 7-methyltricyclo[4.2.0.1$^{2,5}$]non-3-ene, tricyclo[4.4.0.1$^{2,5}$]undec-3-ene, 1-methyltricyclo[4.4.0.1$^{2,5}$]undec-3-ene, 2-methyltricyclo[4.4.0.1$^{2,5}$]undec-3-ene, 2-ethyltricyclo[4.4.0.1$^{2,5}$]undec-3-ene, 8-methyltricyclo[4.4.0.1$^{2,5}$]undec-3-ene, tricyclo[6.4.0.1$^{2,5}$]tridec-3-ene, 2-methyltricyclo[6.4.0.1$^{2,5}$]tridec-3-ene, 8-methyltricyclo[6.4.0.1$^{2,5}$]tridec-3-ene, tricyclo[4.3.0.1$^{2,5}$]deca-3,7-diene, 1-methyltricyclo[4.3.0.1$^{2,5}$]deca-3,7-diene, 2-methyltricyclo[4.3.0.1$^{2,5}$]deca-3,7-diene, 2-ethyltricyclo[4.3.0.1$^{2,5}$]deca-3,7-diene, 5-methyltricyclo[4.3.0.1$^{2,5}$]deca-3,7-diene, 6-methyltricyclo[4.3.0.1$^{2,5}$]deca-3,7-diene, 6-ethyltricyclo[4.3.0.1$^{2,5}$]deca-3,7-diene, 10-methyltricyclo[4.3.0.1$^{2,5}$]deca-3,7-diene, 10-ethyltricyclo[4.3.0.1$^{2,5}$]deca-3,7-diene, 10-phenyltricyclo[4.3.0.1$^{2,5}$]deca-3,7-diene, 10-cyclohexyltricyclo[4.3.0.1$^{2,5}$]deca-3,7-diene, tricyclo[4.4.0.1$^{2,5}$]undeca-3,7-diene, 1-methyltricyclo[4.4.0.1$^{2,5}$]undeca-3,7-diene, 2-methyltricyclo[4.4.0.1$^{2,5}$]undeca-3,7-diene, 2-ethyltricyclo[4.4.0.1$^{2,5}$]undeca-3,7-diene, 7-chlorotricyclo[4.4.0.1$^{2,5}$]undeca-3,7-diene, 7-fluorotricyclo[4.4.0.1$^{2,5}$]undeca-3,7-diene, 8-methyltricyclo[4.4.0.1$^{2,5}$]undeca-3,7-diene, tricyclo[4.4.0.1$^{2,5}$]undeca-3,8-diene, 1-methyltricyclo[4.4.0.1$^{2,5}$]undeca-3,8-diene, 2-methyltricyclo[4.4.0.1$^{2,5}$]undeca-3,8-diene, 2-methyltricyclo[4.4.0.1$^{2,5}$]undeca-3,8-diene, 2-methyltricyclo[4.4.0.1$^{2,5}$]undeca-3,8-diene, 8-methyltricyclo[4.4.0.1$^{2,5}$]undeca-3,8′-diene, tricyclo[6.4.0.1$^{2,5}$]trideca-3,11-diene, 2-methyltricyclo[6.4.0.1$^{2,5}$]trideca-3,1′-diene, 8-methyltricyclo[6.4.0.1$^{2,5}$]trideca-3,11-diene, 2-methyltricyclo[6.4.0.1$^{2,5}$]trideca-3,10-diene, tricyclo[6.4.0.1$^{2,5}$]trideca-3,10-diene, 2-methyltricyclo[6.4.0.1$^{2,5}$]trideca-3,11-diene, 2-methyltricyclo[6.4.0.1$^{2,5}$]trideca-3,9-diene, 9-methyltricyclo[6.4.0.1$^{2,5}$]trideca-3,9-diene, bicyclo[2.2.1]hept-2-ene, 5-methyl-bicyclo[2.2.1]hept-2-ene, 5-ethyl-bicyclo[2.2.1]hept-2-ene, 5-propyl-bicyclo[2.2.1]hept-2-ene, 5-butyl-bicyclo[2.2.1]hept-2-ene, 5-pentyl-bicyclo[2.2.1]hept-2-ene, 5-hexyl-bicyclo[2.2.1]hept-2-ene, 5-heptyl-bicyclo[2.2.1]hept-2-ene, 5-octyl-bicyclo[2.2.1]hept-2-ene, 5-decyl-bicyclo[2.2.1]hept-2-ene, 5-dodecyl-bicyclo[2.2.1]hept-2-ene, 5,6-dimethyl-bicyclo[2.2.1]hept-2-ene, 5-methyl-5-ethyl-bicyclo[2.2.1]hept-2-ene, 5-phenyl-bicyclo[2.2.1]hept-2-ene, 5-cyclohexyl-bicyclo[2.2.1]hept-2-ene, 5-cyclooctyl-bicyclo[2.2.1]hept-2-ene, 5-fluoro-bicyclo[2.2.1]hept-2-ene, 5-chloro-bicyclo[2.2.1]hept-2-ene, tetracyclo[4.4.0.1$^{2,5}$0.1$^{7,10}$]dodec-3-ene, 8-methyl-tetracyclo[4.4.0.1$^{2,5}$0.1$^{7,10}$]dodec-3-ene, 8-ethyl-tetracyclo[4.4.0.1$^{2,5}$0.1$^{7,10}$]dodec-3-ene, bicyclo[2.2.1]hept-5-ene-2-carboxylic acid, methyl bicyclo[2.2.1]hept-5-ene-2-carboxylate, ethyl bicyclo[2.2.1]hept-5-ene-2-carboxylate, butyl bicyclo[2.2.1]hept-5-ene-2-carboxylate, 2-methyl-bicyclo[2.2.1]hept-5-ene-2-carboxylic acid, methyl 2-methyl-bicyclo[2.2.1]hept-5-ene-2-carboxylate, ethyl 2-methyl-bicyclo[2.2.1]hept-5-ene-2-carboxylate, propyl 2-methyl-bicyclo[2.2.1]hept-5-ene-2-carboxylate, butyl 2-methyl-bicyclo[2.2.1]hept-5-ene-2-carboxylate, methyl 2-ethyl-bicyclo[2.2.1]hept-5-ene-2-carboxylate, trichloroethyl 2-methyl-bicyclo[2.2.1]hept-5-ene-2-carboxylate, ethyl 2-methyl-bicyclo[2.2.1]hept-5-ene-2-enylacetate, acrylic acid-2-methyl-bicyclo[2.2.1]hept-5-ene, methacrylic acid-2-methyl-bicyclo[2.2.1]hept-5-ene, dimethyl bicyclo[2.2.1]hept-5-ene-2,3-dicarboxylate, diethyl bicyclo[2.2.1]hept-5-ene-2,3-dicarboxylate, 3-methyl-tetracyclo[4.4.0.1$^{2,5}$.1$^{7,10}$]dodec-8-ene-3-carboxylic acid, tetracyclo[4.4.0.1$^{2,5}$.1$^{7,10}$]dodec-8-ene-3-carboxylic acid, methyl 3-methyl-tetracyclo[4.4.0.1$^{2,5}$.1$^{7,10}$]dodec-8-ene-3-carboxylate, ethyl 3-methyl-tetracyclo[4.4.1$^{2,5}$.1$^{7,10}$] dodec-8-ene-3-carboxylate, 5-trimethoxysilyl-bicyclo[2.2.1]hept-2-ene, 5-dimethoxychlorosilyl-bicyclo[2.2.1]hept-2-ene, 5-methoxychloromethylsilyl-bicyclo[2.2.1]hept-2-ene, 5-dimethoxychlorosilyl-bicyclo[2.2.1]hept-2-ene, 5-methoxyhydridemethylsilyl-bicyclo[2.2.1]hept-2-ene, 5-dimethoxyhydridesilyl-bicyclo[2.2.1]hept-2-ene, 5-methoxydimethylsilyl-bicyclo[2.2.1]hept-2-ene, 5-triethoxysilyl-bicyclo[2.2.1]hept-2-ene, 5-diethoxychlorosilyl-bicyclo[2.2.1]hept-2-ene, 5-ethoxychloromethylsilyl-bicyclo[2.2.1]hept-2-ene, 5-diethoxyhydridesilyl-bicyclo [2.2.1]hept-2-ene, 5-ethoxydimethylsilyl-bicyclo[2.2.1] hept-2-ene, 5-ethoxydiethylsilyl-bicyclo[2.2.1]hept-2-ene, 5-propoxydimethylsilyl-bicyclo[2.2.1]hept-2-ene, 5-tripropoxysilyl-bicyclo[2.2.1]hept-2-ene, 5-triphenoxysilyl-bicyclo[2.2.1]hept-2-ene, 5-trimethoxysilylmethyl-bicyclo [2.2.1]hept-2-ene, 5-dimethylchlorosilyl-bicyclo[2.2.1] hept-2-ene, 5-methyldichlorosilyl-bicyclo[2.2.1]hept-2-ene, 5-trichlorosilyl-bicyclo[2.2.1]hept-2-ene, 5-diethylchlorosilyl-bicyclo[2.2.1]hept-2-ene, 5-ethyldichlorosilyl-bicyclo [2.2.1]hept-2-ene, 5-(2-trimethoxysilyl)ethyl-bicyclo[2.2.1] hept-2-ene, 5-(2-dimethoxychlorosilyl)ethyl-bicyclo[2.2.1] hept-2-ene, 5-(1-trimethoxysilyl)ethyl-bicyclo[2.2.1]hept-2-ene, 5-(2-trimethoxysilyl)propyl-bicyclo[2.2.1]hept-2-ene, 5-(1-trimethoxysilyl)propyl-bicyclo[2.2.1]hept-2-ene, 5-triethoxysilylethyl-bicyclo[2.2.1]hept-2-ene, 5-dimethoxymethylsilylmethyl-bicyclo[2.2.1]hept-2-ene, 5-trimethoxypropylsilyl-bicyclo[2.2.1]hept-2-ene, 8-triethoxysilyl-tetracyclo[4.4.0.1$^{2,5}$.1$^{7,10}$]dodec-3-ene, 8-methyldimethoxysilyl-tetracyclo[4.4.0.1$^{2.5}$.1$^{7,10}$]dodec-3-ene, 5-[1′-methyl-2′,5′-dioxa-1′-silacyclopentyl]-bicyclo[2.2.1]hept-2-ene, 5-[1′-methyl-2′,3′,4′,4′-tetraphenyl-2′,5′-dioxa-1′-silacyclopentyl]-bicyclo[2.2.1]hept-2-ene, 5-[1′-methyl-3′,3′,4′,4′-tetramethyl-2′,5′-dioxa-1′-silacyclopentyl]-bicyclo[2.2.1]

hept-2-ene, 5-[1'-phenyl-2',5'-dioxa-1'-silacyclopentyl]-bicyclo[2.2.1]hept-2-ene, 5-[1'-ethyl-2',5'-dioxa-1'-silacyclopentyl]-bicyclo[2.2.1]hept-2-ene, 5-[1',3'-dimethyl-2',5'-dioxa-1'-silacyclopentyl]-bicyclo[2.2.1]hept-2-ene, 5-[1'-methyl-3',4'-dimethyl-2',5'-dioxa-1'-silacyclopentyl]-bicyclo[2.2.1]hept-2-ene, 5-[1'-methyl-2',6'-dioxa-1'-silacyclohexyl]-bicyclo[2.2.1]hept-2-ene, 5-[1'-ethyl-2',6'-dioxa-1'-silacyclohexyl]-bicyclo[2.2.1]hept-2-ene, 5-[1',3'-dimethyl-2',6'-dioxa-1'-silacyclohexyl]-bicyclo[2.2.1]hept-2-ene, 5-[1'-methyl-4',4'-dimethyl-2',6'-dioxa-1'-silacyclohexyl]-bicyclo[2.2.1]hept-2-ene, 5-[1'-methyl-4',4'-dimethyl-2',6'-dioxa-1'-silacyclohexyl]methyl-bicyclo[2.2.1]hept-2-ene, 5-[1'-methyl-4',4'-dimethyl-2',6'-dioxa-1'-silacyclohexyl]ethyl-bicyclo[2.2.1]hept-2-ene, 5-[1'-phenyl-4',4'-dimethyl-2',6'-dioxa-1'-silacyclohexyl]-bicyclo[2.2.1]hept-2-ene, 5-[1'-methyl-4'-phenyl-2',6'-dioxa-1'-silacyclohexyl]-bicyclo[2.2.1]hept-2-ene, 5-[1'-methyl-4'-spiro-cyclohexyl-2',6'-dioxa-1'-silacyclohexyl]-bicyclo[2.2.1]hept-2-ene, 5-[1'-methyl-4'-ethyl-4'-butyl-2',6'-dioxa-1'-silacyclohexyl]-bicyclo[2.2.1]hept-2ene, 5-[1'-methyl-3',3'-dimethyl-5'-methylene-2',6'-dioxa-1'-silacyclohexyl]-bicyclo[2.2.1]hept-2-ene, 5-[1'-phenyl-2',6'-dioxa-1'-silacyclohexyl]-bicyclo[2.2.1]hept-2-ene, 5-[1'-methyl-3'-phenyl-2',6'-dioxa-1'-silacyclohexyl]-bicyclo[2.2.1]hept-2-ene, 5-[1'-methyl-4',4'-dimethyl-2',6'-dioxa-1'-silacyclohexyl]-7-oxa-bicyclo[2.2.1]hept-2-ene, 5-[1'-methyl-2',6'-dioxa-1'-silacyclohexyl]-7-oxa-bicyclo[2.2.1]hept-2-ene, 5-[1'-methyl-2',7'-dioxa-1'-silacycloheptyl]-bicyclo[2.2.1]hept-2-ene, 3-[1'-methyl-4',4'-dimethyl-2',6'-dioxa-1'-silacyclohexyl]-tetracyclo[4.4.0.1$^{2,5}$1$^{7,10}$]dodec-8-ene and 3-[1'-methyl-2',6'-dioxa-1'-silacyclohexyl]-tetracyclo[4.4.0.1$^{2,5}$1$^{7,10}$]dodec-8-ene.

The cyclic olefin-based polymer may be a copolymer comprising a specific α-olefin compound such as ethylene, propylene, 1-butene, 1-hexene, 1-octene, trimethylsilyl ethylene, triethylsilyl ethylene, styrene, 4-methylstyrene, 2-methylstyrene or 4-ethylstyrene as a monomer in addition to the above monomer forming the cyclic olefin-based polymer.

Examples of the cyclic olefin-based polymer include poly{7,9-(4-methyl-4-methoxycarbonyl[4,3,0,1$^{2,5}$]tricyclodecane)-co-ethylene}, poly{bicyclo[2,2,1]hept-2-ene-co-tricyclo[4,3,0,1$^{2,5}$]dec-3-ene-co-5-triethoxysilyl-bicyclo[2,2,1]hept-2-ene} and poly(bicyclo[2,2,1]hept-2-ene-co-5-hexyl-bicyclo[2,2,1]hept-2-ene). A suitable film may be selected from among these films according to use purpose.

The assembling temperature for fixing the organic polymer film to the polished rear surface in the step (3"), which depends on the melting point of the liquid crystal compound or the melting points of the liquid crystal compound and the organic polymer, is preferably the melting point of the liquid crystal compound or the melting points of the liquid crystal compound and the added organic polymer to (melting point +300° C.), more preferably (melting point +5° C.) to (melting point +250° C.), particularly preferably (melting point +10° C.) to (melting point +200° C.). The assembling time is preferably 1 to 120 minuets, preferably 2 to 90 minuets, more preferably 5 to 60 minutes.

The pressure for assembling the polished wafer with the organic polymer film is not particularly limited and may be suitably selected according to the liquid crystal compound or a combination of the liquid crystal compound and the organic polymer.

In the step (4), the wafer assembled with the organic polymer film is separated. The temporary fixing agent which adheres to and remains on the wafer is cleaned with a solvent in the step (5). When the surface of the wafer on which the temporary fixing agent remains is the front surface having semiconductor elements of the wafer, the temporary fixing agent contained in the elements must be washed away completely. The solvent used for this purpose is suitably selected from solvents which dissolve the liquid crystal compound or both the liquid crystal compound and the organic polymer. Examples of the solvent are the same as those listed above.

EXAMPLES

The following examples are provided for the purpose of further illustrating the present invention but are in no way to be taken as limiting.

Example 1

0.547 g of docosanoic acid (behenic acid) in the form of a solid powder was weighed and placed in a columnar pressure molding apparatus having a diameter of 20 mm, and a pressure of 200 kg·cm$^{-2}$ was applied to the solid powder for 3 minutes to obtain a columnar pellet having a diameter of 20 mm and a thickness of 0.7 mm. This pellet was placed on a 20 cm×20 cm glass substrate having a thickness of 0.7 mm, a 6-inch silicon wafer (thickness of 650 μm) was mounted on the pellet, and the substrate was heated at 120° C. by blowing hot air with a heater. The pellet began to melt at around 80° C. so that the molten docosanoic acid spread over the entire surface of the 6-inch wafer in 2 to 3 minutes. After the temperature was returned to room temperature, the silicon wafer was polished by a commercially available polishing machine. After polishing, the silicon wafer was heated by blowing 150° C. hot air from the polished surface side with a heater and separated from the glass substrate, and the fixed surface of the silicon wafer was cleaned with a 2% aqueous solution of tetramethylammonium hydroxide containing 10% of isopropyl alcohol as a cleaning solvent. When the thickness of the 6-inch silicon wafer was measured, it was 250 μm compared with 650 μm before polishing and variations in thickness within the plane were ±5 μm, which means that the silicon wafer was well polished. When the cleaned surface of the 6-inch silicon wafer was observed through reflection type FT-IR, absorption attributed to the organic substance was not observed at all, which means that the adhesive used for assembly was removed by cleaning.

Example 2

An aluminum substrate was assembled with a glass substrate in the same manner as in Example 1 except that a 6-inch aluminum substrate (thickness of 3 mm) was used in place of the 6-inch silicon wafer, 0.547 g of 1,12-dodecanedicarboxylic acid was used in place of 0.547 g of docosanoic acid, and the temperature for melting 1,12-dodecanedicarboxylic acid was set to 150° C. The aluminum substrate was polished and separated from the glass substrate. Further, the fixed surface was cleaned with a 5% aqueous solution of tetramethylammonium hydroxide. When the thickness of this 6-inch aluminum substrate was measured, it was 2.5 mm compared with 3 mm before polishing and variations in thickness within the plane were 0.01 mm, which means that the aluminum substrate was well polished. When the cleaned surface of the 6-inch aluminum substrate was observed through reflection type FT-IR, absorption attributed to the organic substance was not observed at all, which means that the adhesive used for assembly was removed by cleaning.

Example 3

A plastic substrate was assembled with a glass substrate in the same manner as in Example 1 except that a 13 cm×13 cm polyethylene terephthalate (PET) 6-inch substrate having a thickness of 25 µm was used in place of the 6-inch silicon wafer, polished, separated from the glass substrate and cleaned. When the thickness of the 6-inch plastic substrate was measured after polishing, it was 18 µm compared with 25 µm before polishing and variations in thickness within the plane were ±0.5 µm, which means that the plastic substrate was well polished. When the fixed surface of the 6-inch plastic substrate was observed through reflection type FT-IR, absorption attributed to the organic substance was not observed at all, which means that the adhesive used for assembly was removed by cleaning.

Example 4

A silicon wafer was assembled with a rubber sheet in the same manner as in Example 2 except that a 6-inch silicon wafer having a thickness of 650 µm was used in place of the 6-inch aluminum substrate and a 20 cm×20 cm molded rubber sheet (EP01P of JSR Corporation) having a thickness of 2 mm was used in place of the glass substrate, polished, separated and cleaned. When the thickness of this 6-inch silicon wafer was measured after polishing, it was 400 µm compared with 650 µm before polishing and variations in thickness within the plane were ±0.5 µm, which means that the silicon wafer was well polished. When the fixed and cleaned surface of the 6-inch silicon wafer was observed through reflection type FT-IR, absorption attributed to the organic substance was not observed at all, which means that the adhesive used for assembly was removed by cleaning.

Comparative Example 1

After a 6-inch silicon wafer was assembled with a glass substrate in the same manner as in Example 1 except that a commercially available epoxy adhesive was used in place of docosanoic acid, the surface of the 6-inch silicon wafer was polished. When an attempt was made to remove the 6-inch silicon wafer from the glass substrate in the same manner as in Example 1 after polishing, it was broken. The epoxy resin adhered surface of the partly separated and broken silicon wafer was cleaned with a 5% dimethyl sulfoxide solution of tetramethylammonium hydroxide. When the surface was observed through reflection type FT-IR, absorption attributed to the organic substance was observed, which means that the adhesive used for assembly was not removed completely by cleaning.

Example 5

The entire surface of a 6-inch silicon wafer was uniformly sprayed with 0.5 g of docosanoic acid (behenic acid) in the form of a solid powder, heated at 150° C., stuck on the hard plate of a commercially available CMP apparatus and press contacted to a pad on the base plate at a pressure of 200 g/cm². Thereafter, the surface opposite to the surface stuck on the hard plate of the wafer was polished while a commercially available abrasive solution was applied to the pad. After polishing, the 6-inch silicon wafer was heated by blowing 150° C. hot air from the polished surface side and separated from the hard plate. The fixing agent adhered to the separated 6-inch silicon wafer was removed by cleaning with tetrahydrofuran as a cleaning solvent. When the cleaned surface of the 6-inch silicon wafer was observed through FT-IR, absorption attributed to the organic substance was not observed at all, which means that the fixing agent used for assembly was removed by cleaning.

Example 6

The surface of a 6-inch silicon wafer was polished in the same manner as in Example 5 except that 0.5 g of 1,12-dodecanedicarboxylic acid was used in place of 0.2 g of docosanoic acid. When the cleaned surface of the 6-inch silicon wafer was observed through FT-IR in the same manner as in Example 5 after polishing, absorption attributed to the organic substance was not observed at all, which means that the fixing agent used for assembly was removed by cleaning.

Example 7

The surface of a 6-inch silicon wafer was polished in the same manner as in Example 5 except that 10 g of a 5% tetrahydrofuran/toluene mixed solution (volume ratio of 80/20) of docosanoic acid was used in place of docosanoic acid applied to the wafer by spin coating. When the cleaned surface of the 6-inch silicon wafer was observed through FT-IR in the same manner as in Example 5 after polishing, absorption attributed to the organic substance was not observed at all, which means that the fixing agent used for assembly was removed by cleaning.

Example 8

The surface of a 6-inch silicon wafer was polished in the same manner as in Example 5 except that 10 g of a 5% n-hexane solution of 1,12-dodecanedicarboxylic acid was applied by spin coating instead of spraying 0.5 g of docosanoic acid. When the cleaned surface of the 6-inch silicon wafer was observed through FT-IR in the same manner as in Example 5 after polishing, absorption attributed to the organic substance was not observed at all, which means that the fixing agent used for assembly was removed by cleaning.

Example 9

After the entire surface of a 6-inch silicon wafer was uniformly sprayed with 0.5 g of docosanoic acid, the wafer was heated in a clean oven at 120° C. for 1 hour. After heating, the wafer was taken out and the docosanoic acid coated surface of the 6-inch silicon wafer was assembled with a 30 cm×30 cm glass substrate which was heated at 120° C. separately. Further, a 30 cm×30 cm glass substrate was placed on the docosanoic acid (behenic acid) uncoated surface (to be processed) of the assembled 6-inch silicon wafer, a weight of 50 g was mounted on the glass substrate, and the assembly was left at room temperature for 1 hour. After 1 hour, the glass substrate placed on the uncoated surface (to be processed) of the 6-inch silicon wafer was removed, and the glass substrate assembled with the 6-inch silicon wafer was held on a dedicated glass fixing jig. Thereafter, the 6-inch wafer was polished by a polishing machine while a commercially available abrasive was applied to the wafer. After polishing, the 30 cm×30 cm glass substrate assembled with the 6-inch silicon wafer was removed from the fixing jig and heated in a clean oven at 120° C. for 30 minutes, the 6-inch silicon wafer was removed from the 30 cm×30 cm glass substrate, and further the fixing agent adhered to the 6-inch silicon wafer was removed by cleaning with a tetrahydrofuran/toluene mixed solution (volume ratio of 80/20) as a cleaning solvent. When the cleaned surface of the 6-inch silicon wafer was observed through FT-IR, absorption attributed to the organic substance was not observed at all, which means that the fixing agent used for assembly was removed by cleaning.

Example 10

The surface of a 6-inch silicon wafer was polished in the same manner as in Example 9 except that 0.5 g of 1,12-dodecanedicarboxylic acid was used in place of 0.5 g of docosanoic acid. When the cleaned surface of the 6-inch silicon wafer was observed through FT-IR in the same manner as in Example 9 after polishing, absorption attributed to the organic substance was not observed at all, which means that the fixing agent used for assembly was removed by cleaning.

Example 11

The surface of a 6-inch silicon wafer was polished in the same manner as in Example 9 except that 10 g of a 5% tetrahydrofuran/toluene mixed solution (volume ratio of 80/20) of docosanoic acid was applied by spin coating in place of 0.5 g of docosanoic acid. When the cleaned surface of the 6-inch silicon wafer was observed through FT-IR in the same manner as in Example 9 after polishing, absorption attributed to the organic substance was not observed at all, which means that the fixing agent used for assembly was removed by cleaning.

Example 12

The surface of a 6-inch silicon wafer was polished in the same manner as in Example 10 except that 10 g of a 5% n-hexane/butyl acetate mixed solution (volume ratio of 50/50) of 1,12-dodecanedicarboxylic acid was applied by spin coating in place of 0.5 g of 1,12-dodecanedicarboxylic acid. When the cleaned surface of the 6-inch silicon wafer was observed through FT-IR in the same manner as in Example 10 after polishing, absorption attributed to the organic substance was not observed at all, which means that the fixing agent used for assembly was removed by cleaning.

Comparative Example 2

The surface of a silicon wafer was polished in the same manner as in Example 5 except that 0.2 g of a commercially available epoxy adhesive was used in place of docosanoic acid. When an attempt was made to remove the 6-inch silicon wafer from the hard plate in the same manner as in Example 5 after polishing, it was broken. When the epoxy resin adhered surface of the broken but partly separated silicon wafer was observed through FT-IR, absorption attributed to the organic substance was observed, which means that the fixing agent used for assembly was not removed completely by cleaning.

Example 13

0.075 g of docosanoic acid (behenic acid) in the form of a solid powder was weighed and placed in a columnar pressure molding apparatus having a diameter of 10 mm, and a pressure of 200 kg·cm$^{-2}$ was applied to the solid powder for 5 minutes to obtain a columnar pellet having a diameter of 10 mm and a thickness of 1 mm. This pellet was placed on the hard plate of a commercially available CMP apparatus, a 4-inch silicon wafer was mounted on the pellet, and both the hard plate and the 4-inch silicon wafer were heated by blowing 120° C. hot air. The pellet began to melt at around 80° C. so that the molten docosanoic acid spread over the entire surface of the 4-inch wafer in 1 to 3 minutes after melting. After the temperature was returned to room temperature, the surface opposite to the surface stuck to the hard plate of the silicon wafer was polished while a commercially available abrasive solution was applied to the pad. After polishing, the 4-inch silicon wafer was heated by blowing 150° C. hot air from the polished surface side and separated from the hard plate. The fixing agent adhered to the separated 4-inch silicon wafer was removed by cleaning with tetrahydrofuran as a cleaning solvent. When the cleaned surface of the 4-inch silicon wafer was observed through FT-IR, absorption attributed to the organic substance was not observed at all, which means that the fixing agent used for assembly was removed by cleaning.

Example 14

A 4-inch silicon wafer was stuck on the hard plate of a commercially available CMP apparatus in the same manner as in Example 13 except that 0.070 g of 1,12-dodecanedicarboxylic acid was used in place of 0.075 g of docosanoic acid and the temperature of hot air for melting 1,12-dodecanedicarboxylic acid on the hard plate of the commercially available CMP apparatus was changed to 150° C. to polish the surface of the 4-inch silicon wafer. When the cleaned surface of the 4-inch silicon wafer was observed through FT-IR in the same manner as in Example 13 after polishing, absorption attributed to the organic substance was not observed at all, which means that the fixing agent used for assembly was removed by cleaning.

Example 15

10 g of docosanoic acid (behenic acid) in the form of a solid powder was heated at 120° C. to be molten, the molten docosanoic acid was poured into a columnar molding apparatus having a diameter of 10 mm, the temperature was returned to room temperature, and then the solid docosanoic acid was removed from the columnar molding apparatus to obtain columnar docosanoic acid having a diameter of 10 mm and a length of about 10 cm. This columnar docosanoic acid was cut into a pellet having a thickness of 1 mm with a diamond cutter. The surface of a 4-inch silicon wafer was polished by a commercially available polishing machine in the same manner as in Example 13 using this pellet having a diameter of 10 mm and a thickness of 1 mm. After polishing, the 4-inch silicon wafer was processed in the same manner as in Example 13 and the cleaned surface of the 4-inch silicon wafer was observed through FT-IR. Absorption attributed to the organic substance was not observed at all, which means that the fixing agent used for assembly was removed by cleaning.

Example 16

Columnar 1,12-dodecanedicarboxylic acid having a diameter of 10 mm and a length of about 10 cm was obtained in the same manner as in Example 15 except that 10 g of 1,12-dodecanedicarboxylic acid was heated at 150° C. to be molten in place of 10 g of docosanoic acid. This columnar 1,12-dodecanedicabroxylic acid was cut into a 1 mm-thick pellet with a diamond cutter. The surface of a 4-inch silicon wafer was polished in the same manner as in Example 15 except that this pellet was used and the temperature of hot air was changed to 150° C. When the cleaned surface of the 4-inch silicon wafer was observed through FT-IR in the same manner as in Example 15 after polishing, absorption attributed to the organic substance was not observed at all, which means that the fixing agent used for assembly was removed by cleaning.

Example 17

10 g of docosanoic acid (behenic acid) in the form of a solid powder and 5 g of polyisobutylene were weighed and dissolved in 60 g of tetrahydrofuran. This solution was applied to a glass substrate with an applicator and dried with air to form a 20 µm-thick film. Further, this film was cut into a 5 cm×5 cm piece to make tetragonal pillar-like pellet. A 4-inch silicon wafer was stuck to the hard plate of a commercially available CMP apparatus using this pellet in the same manner as in Example 13 to polish the surface of the 4-inch silicon wafer. When the cleaned surface of the 4-inch silicon wafer was observed through FT-IR in the same manner as in Example 13 after polishing, absorption attributed to the organic substance was not observed at all, which means that the fixing agent used for assembly was removed by cleaning.

Comparative Example 3

The surface of a silicon wafer was polished in the same manner as in Example 13 except that 0.2 g of a commercially available epoxy adhesive was used in place of docosanoic acid. When an attempt was made to remove the 4-inch silicon wafer from the hard plate in the same manner as in Example 13 after polishing, it was broken. When the epoxy resin adhered surface of the broken but partly separated silicon wafer was observed through FT-IR, absorption attributed to the organic substance was observed, which means that the fixing agent used for assembly was not removed completely by cleaning.

Example 18

10 g of docosanoic acid (behenic acid) in the form of a solid powder and 10 g of poly(ethylene-co-vinyl acetate) having a vinyl acetate content of 40 wt % and an intrinsic viscosity of 0.70 were weighed and dissolved in 80 g of tetrahydrofuran. 1 g of the resulting solution was uniformly applied to the entire surface of a 4-inch silicon wafer by spin coating and heated at 100° C. to scatter the solvent. This silicon wafer was further heated at 150° C., stuck on the hard plate of a commercially available CMP apparatus and pressure contacted to a pad on the base plate at a pressure of 200 g/cm². The surface opposite to the surface stuck on the hard plate of the silicon wafer was polished while a commercially available abrasive solution was applied to the pad. After polishing, the 4-inch silicon wafer was heated by blowing 150° C. hot air from the polished surface side and separated from the hard plate. The fixing agent adhered to the separated 4-inch silicon wafer was removed by cleaning with tetrahydrofuran as a cleaning solvent. When the cleaned surface of the 4-inch silicon wafer was observed through FT-IR, absorption attributed to the organic substance was not observed at all, which means that the fixing agent used for assembly was removed by cleaning.

Example 19

A solution was prepared in the same manner as in Example 18 except that 10 g of 1,12-dodecanedicarboxylic acid was used in place of 10 g of docosanoic acid and used to polish the surface of a 4-inch silicon wafer. When the cleaned surface of the 4-inch silicon wafer was observed through FT-IR after the polished silicon wafer was separated and cleaned in the same manner as in Example 18, absorption attributed to the organic substance was not observed at all, which means that the fixing agent used for assembly was removed by cleaning.

Example 20

A solution was prepared in the same manner as in Example 18 except that 10 g of polyisobutylene having a number average molecular weight of 250,000 and a melting point of 44° C. was used in place of 10 g of poly(ethylene-co-vinyl acetate) and used to polish the surface of a 4-inch silicon wafer in the same manner as in Example 18. When the cleaned surface of the 4-inch silicon wafer was observed through FT-IR after the polished silicon wafer was separated and cleaned in the same manner as in Example 18, absorption attributed to the organic substance was not observed at all, which means that the fixing agent used for assembly was removed by cleaning.

Example 21

A solution was prepared in the same manner as in Example 20 except that 10 g of 1,12-dodecanedicarboxylic acid was used in place of 10 g of docosanoic acid and used to polish the surface of a 4-inch silicon wafer in the same manner as in Example 20. When the cleaned surface of the 4-inch silicon wafer was observed through FT-IR after the polished silicon wafer was separated and cleaned in the same manner as in Example 20, absorption attributed to the organic substance was not observed at all, which means that the fixing agent used for assembly was removed by cleaning.

Example 22

A solution was prepared in the same manner as in Example 18 except that 10 g of polyvinyl chloride having a number average molecular weight of 350,000 and a melting point of 200° C. was used in place of 10 g of poly(ethylene-co-vinyl acetate) and used to polish the surface of a 4-inch silicon wafer in the same manner as in Example 18. When the cleaned surface of the 4-inch silicon wafer was observed through FT-IR after the polished silicon wafer was separated and cleaned in the same manner as in Example 18, absorption attributed to the organic substance was not observed at all, which means that the fixing agent used for assembly was removed by cleaning.

Example 23

A solution was prepared in the same manner as in Example 22 except that 10 g of 1,12-dodecanedicarboxylic acid was used in place of 10 g of decosanoic acid and used to polish the surface of a 4-inch silicon wafer in the same manner as in Example 22. When the cleaned surface of the 4-inch silicon wafer was observed through FT-IR after the polished silicon wafer was separated and cleaned in the same manner as in Example 22, absorption attributed to the organic substance was not observed at all, which means that the fixing agent used for assembly was removed by cleaning.

Example 24

A solution was prepared in the same manner as in Example 18 except that 5 g of polyisobutylene having a number average molecular weight of 250,000 and a melting point of 44° C. and 5 g of poly(ethylene-co-vinyl acetate) were used in place of 10 g of poly(ethylene-co-vinyl acetate). This solution was used to polish the surface of a 4-inch silicon wafer in the same manner as in Example 18. When the cleaned surface of the 4-inch silicon wafer was observed through FT-IR after the polished silicon wafer was separated and cleaned in the same manner as in Example 18, absorption attributed to the organic substance was not observed at all, which means that the fixing agent used for assembly was removed by cleaning.

Example 25

The solution prepared in Example 18 was applied to a glass substrate with an applicator, left at room temperature for 24 hours, dried at 100° C. for 3 hours and removed from the glass substrate to form a 25 μm-thick film for fixing a wafer. This film was affixed to a silicon wafer heated at 100° C., further heated at 150° C., stuck on the hard plate of a commercially available CMP apparatus, and press contacted to a pad on the base plate at a pressure of 200 g/cm² to be fixed. The surface polishing, separating from the hard plate and cleaning of the 4-inch silicon wafer were carried out in the same manner as in Example 18. When the cleaned surface of the 4-inch silicon wafer was observed through FT-IR, absorption attributed to the organic substance was not observed at all, which means that the film used for assembly was removed by cleaning.

Example 26

A 23 μm-thick film for fixing a wafer was manufactured in the same manner as in Example 25 using the solution prepared in Example 19 and then used to polish the surface of a wafer, separate the wafer and clean it in the same manner as in Example 25. When the cleaned surface of the 4-inch silicon wafer was observed through FT-IR, absorption attributed to the organic substance was not observed at all, which means that the film used for assembly was removed by cleaning.

Example 27

A 26 μm-thick film for fixing a wafer was manufactured in the same manner as in Example 25 using the solution prepared in Example 22 and then used to polish the surface of a wafer, separate the wafer and clean it in the same manner as in Example 25. When the cleaned surface of the 4-inch silicon wafer was observed through FT-IR, absorption attributed to the organic substance was not observed at all, which means that the film used for assembly was removed by cleaning.

Example 28

A 24 μm-thick film for fixing a wafer was manufactured in the same manner as in Example 25 using the solution prepared in Example 24 and then used to polish the surface of a wafer, separate the wafer and clean it in the same manner as in Example 25. When the cleaned surface of the 4-inch silicon wafer was observed through FT-IR, absorption attributed to the organic substance was not observed at all, which means that the film used for assembly was removed by cleaning.

Example 29

14.8 g of docosanoic acid (behenic acid) in the form of a solid powder was sprayed on the base plate of a commercially available CMP apparatus (EPO112 of Ebara Corporation), and an urethane pad (IC1000 of Rodel Nitta Co., Ltd.) having a diameter of 787 mm and a thickness of 2.5 mm from which an adhesive double-coated tape on the rear surface had been removed was placed on the docosanoic acid and heated by blowing 100° C. hot air with a heater. The solid powder began to melt at around 80° C. so that the molten docosanoic acid spread uniformly over the entire surface of the pad by the weight of the pad in 2 to 3 minutes. Thereafter, the pad was left to be cooled to room temperature so as to be fixed on the base plate. The thickness of the fixing agent layer between the pad and the base plate was 0.030 mm (calculated value).

An 8-inch silicon wafer was polished on the CMP pad fixed on the base plate by the method of the present invention with a silica slurry (CMS1101 of JSR Corporation) chemical mechanically under the following conditions.

Load of carrier: 300 g/cm²
Revolution of carrier: 50 rpm
Revolution of base plate: 100 rpm
Feed rate of slurry: 200 ml/minute
Polishing time: 3 minutes
Polishing temperature: 25° C.

During polishing, the CMP pad was kept fixed without being separated from the base plate. After polishing, the CMP pad was heated by blowing 120° C. hot air to be separated from the base plate. Thereafter, the CMP pad fixing agent adhered to and remaining on the base plate was separated by cleaning with tetrahydrofuran as a cleaning solvent.

The CMP pad fixed on the base plate by the method of this Example could be easily separated by heating. The organic substance was not observed on the base plate from which the CMP pad had been separated.

Example 30

A CMP pad was fixed on the base plate in the same manner as in Example 29 except that 14.9 g of 1,12-dodecanedicarboxylic acid was used in place of 14.8 g of docosanoic acid and that the temperature of hot air for melting 1,12-dodecanedicarboxylic acid was changed to 150° C. The thickness of the pad fixing agent layer between the pad and the base plate was 0.030 mm (calculated value).

Chemical mechanical polishing was carried out on the fixed CMP pad in the same manner as in Example 29. During polishing, the CMP pad was kept fixed without being separated from the base plate. After polishing, the CMP pad was heated by blowing 150° C. hot air to be separated from the base plate. Then, the CMP pad fixing agent adhered to and remaining on the base plate was removed by cleaning with tetrahydrofuran as a cleaning solvent.

The CMP pad fixed on the base plate by the method of Example 30 could be easily separated by heating. The organic substance on the base plate from which the CMP pad had been separated was not observed.

Example 31

14.8 g of docosanoic acid (behenic acid) in the form of a solid powder was weighed and placed in a columnar pressure molding apparatus having a diameter of 50 mm, and a pressure of 200 kg·cm$^{-2}$ was applied to the solid powder for 5 minutes to obtain a columnar pellet having a diameter of 50 mm and a thickness of 7.5 mm. This pellet was placed on the base plate of a commercially available CMP apparatus (EPO112 of Ebara Corporation), and an urethane pad (IC1000 of Rodel Nitta Co., Ltd.) having a diameter of 787 mm and a thickness of 2.5 mm from which an adhesive double-coated tape on the rear surface had been removed was mounted on the pellet and heated by blowing 100° C. hot air with a heater. The pellet began to melt at around 80° C. so that the molten docosanoic acid spread uniformly over the entire surface of the pad in 2 to 3 minutes. The thickness of the pad fixing agent layer between the pad and the base plate was 0.030 mm (calculated value).

Chemical mechanical polishing was carried out on the fixed CMP pad in the same manner as in Example 29. During polishing, the CMP pad was kept fixed without being removed from the base plate. After polishing, the CMP pad was heated by blowing 120° C. hot air to be separated from the base plate. Thereafter, the CMP pad fixing agent adhered to and remaining on the base plate was removed by cleaning with tetrahydrofuran as a cleaning solvent.

The CMP pad fixed on the base plate by the method of this Example could be easily separated by heating and the organic substance was not observed on the base plate from which the CMP pad had been separated.

Example 32

A pad was fixed on the base plate in the same manner as in Example 31 except that 15.0 g of 1,12-dodecandicarboxylic acid was used in place of 14.8 g of docosanoic acid, the diameter of the columnar pressure molding apparatus was changed to 20 mm, and the temperature of hot air for melting 1,12-dodecanedicarboxylic acid was changed to 150° C. The thickness of the pad fixing agent layer between the pad and the base plate was 0.030 mm (calculated value).

Chemical mechanical polishing was carried out on the fixed CMP pad in the same manner as in Example 29. During polishing, the CMP pad was kept fixed without being separated from the base plate. After polishing, the CMP pad was heated by blowing 150° C. hot air to be removed from the base plate. Thereafter, the CMP pad fixing agent adhered to and remaining on the base plate was removed by cleaning with tetrahydrofuran as a cleaning solvent.

The CMP pad fixed on the base plate by the method of this Example could be easily separated by heating and the organic substance was not observed on the base plate from which the CMP pad had been separated.

Comparative Example 4

A CMP pad was fixed on the base plate in the same manner as in Example 29 except that 15.0 g of a commercially available epoxy adhesive was applied instead of spraying docosanoic acid.

Chemical mechanical polishing was carried out on the fixed CMP pad in the same manner as in Example 29. During polishing, the CMP pad was kept fixed without being separated from the base plate. When an attempt was made to separate the CMP pad from the base plate after chemical mechanical polishing, the CMP pad could not be easily separated.

Example 33

The entire surface of a 6-inch silicon wafer (of SKW Co., Ltd.) manufactured by forming a 0.9 μm-thick TEOS (triethoxysilane) film on a silicon substrate having grooves with a width of 250 μm and a depth of 0.8 μm at a pitch of 500 μm obtained by an STI process was uniformly sprayed with 0.547 g of docosanoic acid (behenic acid)(melting point =74 to 84° C.) in the form of a solid powder to a total film thickness of 2 μm, heated at 120° C., stuck on the hard plate of a commercially available CMP apparatus and press contacted to a pad on the base plate at a pressure of 200 kg/cm$^2$. Thereafter, the surface opposite to the surface stuck on the hard plate of the silicon wafer was polished while a commercially available abrasive solution was applied to the pad. Polishing conditions included the CMS1101 slurry of JSR Corporation, the EPO112 chemical mechanical polishing machine, a slurry feed rate of 200 ml/min, a polishing load of 400 g/cm$^2$, a base plate revolution of 70 rpm and a polishing depth from the surface of 100 nm. After polishing, the 6-inch silicon wafer was heated by blowing 120° C. hot air from the polished surface side and separated from the hard plate. The fixing agent adhered to the separated 6-inch silicon wafer was removed by cleaning with a 2 wt % aqueous solution of tetramethylammonium hydroxide as a cleaning solvent. When the cleaned surface of the 6-inch silicon wafer was observed through FT-IR and ESCA, absorption attributed to the organic substance was not observed at all, which means that the wafer fixing agent used for assembly was removed by cleaning. Thereafter, when the section having a pattern of the wafer was observed through SEM, it was confirmed that the fixing agent did not remain in the pattern and on the entire substrate at all. When an SEM photo of the pattern before assembly was compared with an SEM photo of the pattern after assembly, it was confirmed that the destruction and deformation of the pattern did not occur at all during the processing.

Example 34

The surface of a 6-inch silicon wafer was polished in the same manner as in Example 33 except that 0.547 g of 1,10-decanedicarboxylic acid (dodecanoic diacid) (melting point=128 to 131° C.) was used in place of 0.547 g of docosanoic acid and a 6-inch silicon wafer was heated at 150° C. When the cleaned surface having a pattern of the 6-inch silicon wafer was observed through FT-IR and ESCA in the same manner as in Example 33 after polishing, absorption attributed to the organic substance was not observed at all, which means that the fixing agent used for assembly was removed by cleaning. Thereafter, when the section having a pattern of the wafer was observed through SEM, it was confirmed that the fixing agent did not remain in the pattern and on the entire substrate at all. When an SEM photo of the pattern before assembly was compared with an SEM photo of the pattern after assembly, it was confirmed that the destruction and deformation of the pattern did not occur at all during the processing.

Example 35

The surface of a 6-inch silicon wafer was polished in the same manner as in Example 33 except that 10 g of a 5 wt % tetrahydrofuran/toluene (volume ratio=80/20) mixed solution of docosanoic acid was applied to the wafer by spin coating in place of docosanoic acid, dried at 120° C. for 30 minutes and heated again to be assembled with the hard plate. When the cleaned surface having a pattern of the 6-inch silicon wafer was observed through FT-IR and ESCA in the same manner as in Example 33 after polishing, absorption attributed to the organic substance was not observed at all, which means that the fixing agent used for assembly was removed by cleaning.

Thereafter, when the section having a pattern of the wafer was observed through SEM, it was confirmed that the fixing agent did not remain in the pattern and on the entire substrate at all. When an SEM photo of the pattern before assembly was compared with an SEM photo of the pattern after assembly, it was confirmed that the destruction and deformation of the pattern did not occur at all during the processing.

Example 36

0.547 g of docosanoic acid (behenic acid) in the form of a solid powder was weighed and placed in a columnar pressure molding apparatus having a diameter of 20 mm, and a pressure of 200 kg·cm$^{-2}$ was applied to the solid powder for 5 minutes to obtain a columnar pellet having a diameter of 20 mm and a thickness of 1.7 mm. This pellet was placed on the wafer used in Example 33 and assembled with the hard plate in the same manner as in Example 33. The pellet began to melt at around 80° C. so that the molten docosanoic acid spread over the entire surface of the 6-inch wafer in 2 to 3 minutes. After the temperature was returned to room temperature, the surface opposite to the stuck surface of the wafer was polished in the same manner as in Example 33. After polishing, the 6-inch silicon wafer was heated by blowing 120° C. hot air from the polished surface side and separated from the hard plate. The fixing agent adhered to the separated 6-inch wafer was removed by cleaning with a 2 wt % aqueous solution of tetramethylammonium hydroxide as a cleaning solvent. When the cleaned surface having a pattern of the 6-inch silicon wafer was observed through FT-IR and ESCA, absorption attributed to the organic substance was not observed at all, which means that the fixing agent used for assembly was removed by cleaning. Thereafter, when the section having a pattern of the wafer was observed through SEM, it was confirmed that the fixing agent did not remain in the pattern and on the entire substrate at all. When an SEM photo of the pattern before assembly was compared with an SEM photo of the pattern after assembly, it was confirmed that the destruction and deformation of the pattern did not occur at all during the processing.

Example 37

A 6-inch silicon wafer was stuck on the hard plate of a commercially available CMP apparatus to polish the surface of the 6-inch silicon wafer in the same manner as in Example 36 except that 0.547 g of 1,10-decanedicarboxylic acid was used in place of 0.547 g of docosanoic acid and the temperature of hot air for melting 1,10-decanedicarboxylic acid was changed to 150° C. When the cleaned surface having a pattern of the 6-inch silicon wafer was observed through FT-IR and ESCA in the same manner as in Example 36 after polishing, absorption attributed to the organic substance was not observed at all, which means that the fixing agent used for assembly was removed by cleaning. Thereafter, when the section having a pattern of the wafer was observed through SEM, it was confirmed that the fixing agent did not remain in the pattern and on the entire substrate at all. When an SEM photo of the pattern before assembly was compared with an SEM photo of the pattern after assembly, it was confirmed that the destruction and deformation of the pattern did not occur at all during the processing.

Example 38

10 g of docosanoic acid (behenic acid) in the form of a solid powder was molten by heating at 120° C. the molten docosanoic acid was poured into a columnar molding apparatus having a diameter of 10 mm, the temperature was returned to room temperature, and the solid docosanoic acid was removed from the columnar molding apparatus to obtain columnar docosanoic acid having a diameter of 10 mm and a length of about 10 cm. This columnar docosanoic acid was cut into a pellet having a thickness of 3 mm with a diamond cutter. This pellet having a diameter of 10 mm and a thickness of 3 mm was used to polish the surface of a 6-inch silicon wafer by a commercially available polishing machine in the same manner as in Example 36. After polishing, the 6-inch silicon wafer was processed in the same manner as in Example 36. When the cleaned surface having a pattern of the 6-inch silicon wafer was observed through FT-IR and ESCA, absorption attributed to the organic substance was not observed at all, which means that the fixing agent used for assembly was removed by cleaning. Thereafter, when the section having a pattern of the wafer was observed through SEM, it was confirmed that the fixing agent did not remain in the pattern and on the entire substrate at all. When an SEM photo of the pattern before assembly was compared with an SEM photo of the pattern after assembly, it was confirmed that the destruction and deformation of the pattern did not occur at all during the processing.

Example 39

Columnar 1,10-decanedicarboxylic acid having a diameter of 10 mm and a length of about 10 cm was obtained in the same manner as in Example 38 except that 10 g of 1,10-decanedicarboxylic acid was molten by heating at 150° C. in place of 10 g of docosanoic acid. This columnar 1,10-decanedicarboxylic acid was cut into a pellet having a thickness of 3 mm with a diamond cutter. This pellet was used to polish the surface of a 6-inch silicon wafer in the same manner as in Example 35 except that the temperature of hot air was changed to 150° C. When the cleaned surface having a pattern of the 6-inch silicon wafer was observed through FT-IR and ESCA in the same manner as in Example 38 after polishing, absorption attributed to the organic substance was not observed at all, which means that the fixing agent used for assembly was removed by cleaning. Thereafter, when the section having a pattern of the wafer was observed through SEM, it was confirmed that the fixing agent did not remain in the pattern and on the entire substrate at all. When an SEM photo of the pattern before assembly was compared with an SEM photo of the pattern after assembly, it was confirmed that the destruction and deformation of the pattern did not occur at all during the processing.

Comparative Example 5

The surface of a 6-inch silicon wafer was polished in the same manner as in Example 33 except that 0.547 g of the EP160, a commercially available epoxy adhesive manufactured by Cemedine Co., Ltd., was used in place of docosanoic acid. When an attempt was made to remove the 6-inch silicon wafer from the hard plate in the same manner as in Example 33 after polishing, it was broken. When the epoxy resin adhered surface of the broken but partly separated silicon wafer was observed through FT-IR, absorption attributed to the organic substance was observed, which means that the adhesive used for assembly could not be removed completely by cleaning.

Example 40

0.547 g of docosanoic acid (behenic acid) (melting point=74 to 80° C.) in the form of a solid powder was uniformly applied to the entire surface of a 6-inch silicon wafer, heated at 120° C. and assembled with another 6-inch silicon wafer. This assembled silicon wafer was polished to a depth of 150 μm by the EPO112 commercially available CMP chemical mechanical polishing machine using the CMS1101 slurry of JSR Corporation at a slurry feed rate of 200 ml/min, a polishing load of 400 g/cm$^2$ and a base plate revolution of 70 rpm. After the polished surface was rinsed in water and dried with air, the Riva Alpha No. 3195M dicing tape of Nitto Denko Corporation was affixed to the polished surface. The surface opposite to the dicing tape affixed surface of the 6-inch silicon wafer was heated by blowing 90° C. hot air to separate the unpolished wafer from the wafer having the dicing tape affixed thereto without breaking and deforming the wafers. The fixing agent adhered to the separated surface of the wafer having the dicing tape affixed thereto was removed by cleaning with a 2 wt % aqueous solution of tetramethylammonium hydroxide as a cleaning solvent. When the cleaned surface of the 6-inch silicon wafer was observed through FT-IR and ESCA, absorption attributed to the organic substance was not observed at all, which means that the fixing agent used for assembly was removed by cleaning. When dicing was carried out based on the specifications of the dicing tape by a commercially available dicing machine, small pieces of the wafer could be obtained without breaking or deforming the wafer.

Example 41

0.547 g of docosanoic acid (behenic acid) in the form of a solid powder was weighed and placed in a columnar pressure molding apparatus having a diameter of 20 mm, and a pressure of 200 kg·cm$^{-2}$ was applied to the solid powder for 5 minutes to obtain a columnar pellet having a diameter of 20 mm and a thickness of 1.7 mm. This pellet was placed on the wafer used in Example 40 and stuck on the hard plate in the same manner as in Example 40. The pellet began to melt at around 80° C. so that the molten docosanoic acid spread over the entire surface of the 6-inch wafer in 2 to 3 minutes. After the temperature was returned to room temperature, the surface opposite to the stuck surface of the silicon wafer was polished to a depth of 100 μm in the same manner as in Example 40. A dicing tape was affixed to the silicon wafer in the same manner as in Example 40 after polishing and then separation, cleaning and dicing were carried out. Small pieces of the wafer could be obtained without breaking or deforming the wafer like Example 40.

Example 42

A 6-inch silicon wafer and a 6-inch glass wafer were assembled together in the same manner as in Example 41 except that 0.547 g of a dodecanoic diacid (melting point=128 to 131° C.) pellet was used in place of docosanoic acid, the heating temperature for assembling wafers was changed to 140° C., and the Riva Alpha No. 3194H of Nitto Denko Corporation was used as the dicing tape. The silicon wafer was polished to a depth of 120 μm and the dicing tape was affixed to the polished surface. When separation, cleaning and dicing were further carried out in the same manner as in Example 41, small pieces of the wafer could be obtained without breaking or deforming the wafer.

Example 43

Two 6-inch silicon wafers were assembled together in the same manner as in Example 41 except that 0.547 g of a palmitic acid (melting point=60 to 63° C.) pellet was used in place of docosanoic acid, the heating temperature for assembling wafers was changed to 75° C., and the Riva Alpha No. 3195 of Nitto Denko Corporation was used as the dicing tape. One of the silicon wafers was polished to a depth of 175 μm and the dicing tape was affixed to the polished surface. When separation, cleaning and dicing were further carried out in the same manner as in Example 41, small pieces of the wafer could be obtained without breaking or deforming the wafer.

Example 44

0.547 g of docosanoic acid (behenic acid) (melting point=74 to 80° C.) in the form of a solid powder was uniformly applied to the entire surface of a 6-inch silicon wafer and heated at 120° C. to assemble the silicon wafer with another 6-inch silicon wafer. The assembled silicon wafer was polished to a depth of 150 μm by the EPO112 commercially available CMP chemical mechanical polishing machine using the CMS1101 slurry of JSR Corporation at a slurry feed rate of 200 ml/min, a polishing load of 400 g/cm$^2$ and a base plate revolution of 70 rpm. After the polished surface was rinsed in water and dried with air, a commercially available 50 μm-thick polyethylene terephthalate (PET) film was affixed to the polished surface with 0.547 g of dodecanoic diacid (melting point=128 to 131° C.) by heating at 140° C. Thereafter, the 6-inch silicon wafer was heated by blowing 90° C. hot air on the surface opposite to the PET film affixed surface to separate the wafer from the PET film affixed wafer without breaking and deforming the wafers. Thereafter, the fixing agent adhered to the separated surface of the wafer having the PET film affixed thereto was removed by cleaning with a 2 wt % aqueous solution of tetramethylammonium hydroxide as a cleaning solvent. Thereafter, when the 6-inch wafer having the PET film affixed thereto was carried to the dicing stage of a dicing machine, it could be carried without being broken or deformed.

Example 45

0.547 g of docosanoic acid (behenic acid) in the form of a solid powder was weighed and placed in a columnar pressure molding apparatus having a diameter of 20 mm, and a pressure of 200 kg·cm$^{-2}$ was applied to the solid powder for 5 minutes to obtain a columnar pellet having a diameter of 20 mm and a thickness of 1.7 mm. This pellet was placed on the wafer used in Example 1 and assembled with a 6-inch silicon wafer in the same manner as in Example 44. The pellet began to melt at around 80° C. so that the molten docosanoic acid spread over the entire surface of the 6-inch wafer in 2 to 3 minutes. After the temperature was returned to room temperature, one of the silicon wafers was polished to a thickness of 100 μm in the same manner as in Example 44. After polishing, a 50 μm-thick PET film was affixed to the silicon wafer in the same manner as in Example 44, the silicon wafer was separated from the other silicon wafer, cleaned and carried to the dicing stage of a dicing machine. The wafer could be carried without being broken or deformed like Example 44.

Example 46

A 6-inch silicon wafer and a 6-inch glass wafer were assembled together in the same manner as in Example 45 except that 0.547 g of a dodecanoic diacid pellet was used in place of docosanoic acid, the heating temperature for assembling wafers was changed to 140° C. and a poly{7,9-(4-methyl-4-methoxycarbonyl[4.3.0.1$^{2,5}$]tricyclod ecane)-co-ethylene} polymer film (thickness of 25 μm; Arton of JSR Corporation) was used as the organic polymer film. After the silicon wafer was polished to a depth of 120 μm, the Arton film (norbornene-based resin film of JSR Corporation) was affixed to the polished surface. When the silicon wafer was separated from the glass wafer, cleaned and carried to the dicing stage of a dicing machine in the same manner as in Example 45, it could be carried without being broken or deformed.

Example 47

Two 6-inch silicon wafers were assembled together in the same manner as in Example 45 except that 0.547 g of a palmitic acid (melting point=60 to 63° C.) pellet was used in place of docosanoic acid, the heating temperature for assembling wafers was changed to 75° C., and the Arton film of JSR Corporation was used as the organic polymer film. After one of the silicon wafers was polished to a depth of 175 μm, the Arton film was affixed to the polished surface. When the silicon wafer was separated from the other silicon wafer, cleaned and carried to the dicing stage of a dicing machine in the same manner as in Example 45, it could be carried without being broken or deformed.

The invention claimed is:

1. A method of temporarily fixing two solids, comprising temporarily fixing the two solids to each other with a liquid crystal compound or a composition comprising the liquid crystal compound by positioning the liquid crystal compound or the composition between the two solids, wherein the liquid crystal compound or the composition comprising the liquid crystal compound is heated at a temperature equal to or higher than the melting point of the liquid crystal compound and then cooled to a temperature lower than the melting point to achieve close contact between the two solids.

2. The method of temporarily fixing two solids according to claim 1, wherein the composition comprising the liquid crystal compound is a solution of the liquid crystal compound dissolved in a solvent, and the solvent is removed from the solution between the two solids to achieve close contact between the two solids.

3. The method of temporarily fixing two solids according to claim 1, wherein the two solids are each independently made from a material selected from the group consisting of metal, silicon, glass, ceramic, magnetic material, plastic, rubber, wood, paper and cloth.

4. A method of separating two solids from each other, comprising separating the two solids which are temporarily fixed to each other by the fixing method of claim 1 by melting the liquid crystal compound therebetween from each other.

* * * * *